(12) United States Patent
Tada et al.

(10) Patent No.: US 9,800,179 B2
(45) Date of Patent: Oct. 24, 2017

(54) LINEAR DRIVING DEVICE, ELECTRONIC DEVICE AND HUMAN BODY FITTING ARTICLE BOTH EMPLOYING SUCH LINEAR DRIVING DEVICE

(71) Applicant: New Shicoh Technology Co., Ltd., Yamato (JP)

(72) Inventors: Junichi Tada, Yamato (JP); Hiroki Narushima, Yamato (JP); Yoshitaka Mori, Yamato (JP)

(73) Assignee: NEW SHICOH TECHNOLOGY CO., LTD., Kanagawa Pref. (JP)

( * ) Notice: Subject to any disclaimer, the term of this patent is extended or adjusted under 35 U.S.C. 154(b) by 512 days.

(21) Appl. No.: 14/491,577

(22) Filed: Sep. 19, 2014

(65) Prior Publication Data

US 2015/0084484 A1    Mar. 26, 2015

(30) Foreign Application Priority Data

Sep. 20, 2013  (JP) .................. 2013-195174
Dec. 13, 2013  (JP) .................. 2013-258198
Jun. 13, 2014  (JP) .................. 2014-122237

(51) Int. Cl.
*H02N 2/02*  (2006.01)
*H01L 41/09*  (2006.01)
*G06F 3/01*  (2006.01)

(52) U.S. Cl.
CPC ............. *H02N 2/025* (2013.01); *G06F 3/016* (2013.01); *H01L 41/0973* (2013.01)

(58) Field of Classification Search
CPC ................. H01L 41/09; H02N 2/025

(Continued)

(56) References Cited

U.S. PATENT DOCUMENTS 9,064,663 B2 *  6/2015  Taka ................. H01H 57/00
2012/0223824 A1  9/2012  Rothkopf
2013/0161164 A1  6/2013  Taka et al.

FOREIGN PATENT DOCUMENTS

CN    102789314    11/2012
CN    103186282 A   7/2013
(Continued)

OTHER PUBLICATIONS

Office Action issued on Apr. 1, 2016, by the State Intellectual Property Office of the People's Republic of China in corresponding Chinese Patent Application No. 201410076633.0, and English translation. (11 pages).

(Continued)

*Primary Examiner* — J. San Martin
(74) *Attorney, Agent, or Firm* — Buchanan Ingersoll & Rooney PC

(57) ABSTRACT

A linear driving device includes a slight rapid vibratory movements producing member coupled with one end of a driving shaft which causes said driving shaft to be moved in said an axial direction, a casing for supporting at least either said driving shaft or said slight rapid vibratory movements producing member so that said driving shaft can be moved in said axial direction; and a moving body to be coupled with said driving shaft so that said moving body can be moved in the axial direction. When said moving body moves from one end side toward the other end side of said driving shaft, a part of said moving body which forms the surface facing the other end side opposite to said one end side of said moving body may hit against a component which stops said moving body from moving further toward the other end side of said driving shaft.

10 Claims, 17 Drawing Sheets

(58) Field of Classification Search
USPC .......................................................... 310/323
See application file for complete search history.

(56) References Cited

FOREIGN PATENT DOCUMENTS

| | | |
|---|---|---|
| JP | 2005-176121 A | 6/2005 |
| JP | 2008-259345 A | 10/2008 |
| JP | 2011-245437 A | 12/2011 |

OTHER PUBLICATIONS

Office Action issued on Apr. 22, 2016, by the State Intellectual Property Office of the People's Republic of China in corresponding Chinese Patent Application No. 201410487207.6, and English translation. (14 pages).
Second Office Action issued in corresponding Chines Patent Application No. 201410487207.6; dated Dec. 19, 2016, with English Translation (15 pages).

* cited by examiner

MOVING UPWARDS

→ FLOW OF AIR

MOVING DOWNWARDS

→ FLOW OF AIR

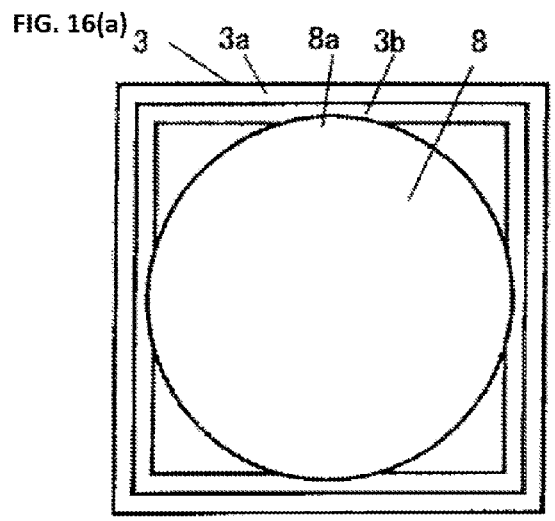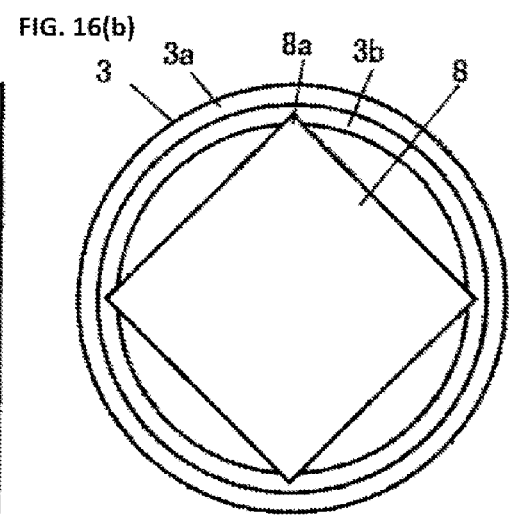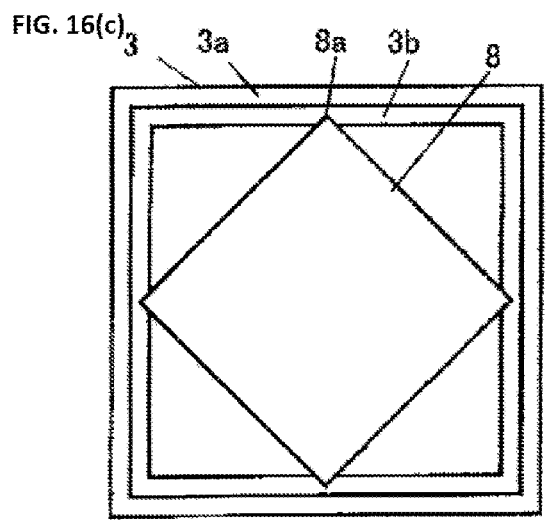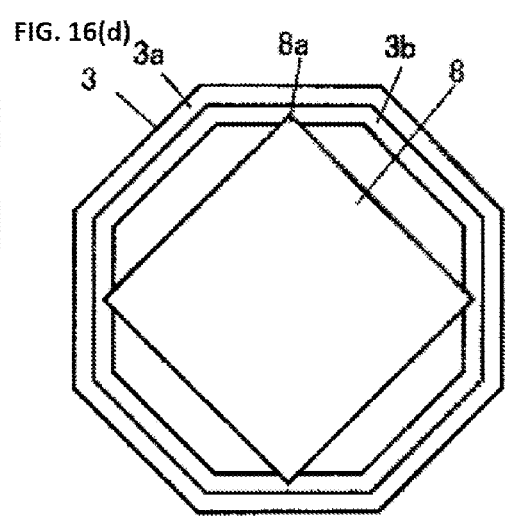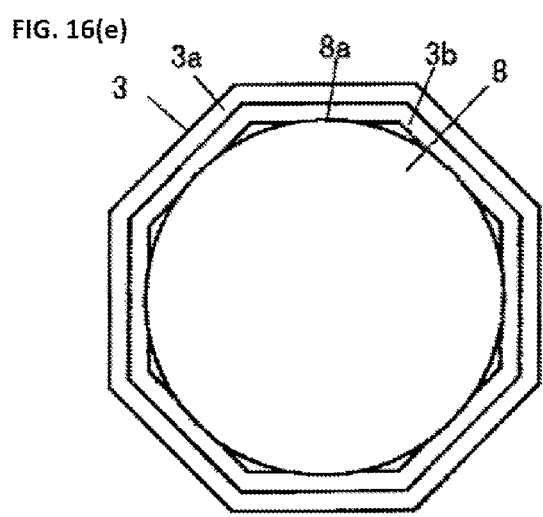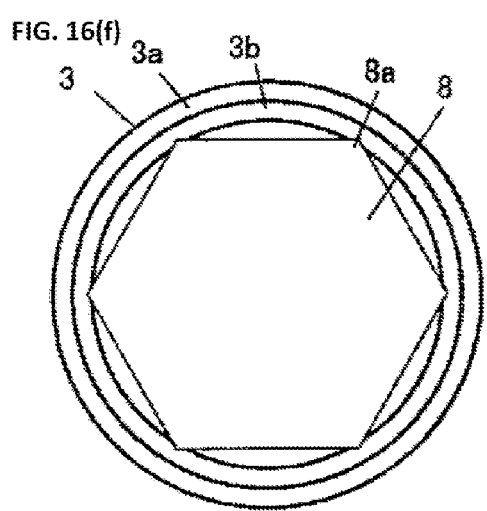

LINEAR DRIVING DEVICE, ELECTRONIC DEVICE AND HUMAN BODY FITTING ARTICLE BOTH EMPLOYING SUCH LINEAR DRIVING DEVICE

BACKGROUND OF THE INVENTION

Field of the Invention

The present invention relates to a linear driving device designed for use with an input unit such as a touch panel display or the like. The present invention also relates to an electronic device and a human body fitting article both having such linear driving device integrated therein.

Description of the Relevant Art

As it is known in the conventional prior art, there is an input unit that includes a display in which a touch panel function is incorporated or an input unit on which the operating keys are provided. Among those input units, there is one input unit in which a linear driving system-based vibration producing device is previously incorporated and which enables an operator to enter information by pressing the appropriate keys with a finger or a pen. In response to the information thus entered, the input unit will activate the vibration producing device to produce the corresponding vibrations that are returned and imparted to the finger or the pen, thus providing the operator with the impression that the information has been entered surely and correctly. As one example of such linear driving system-based vibration producing device, Patent Document 1 discloses the vibration producing device that includes a base, a piezoelectric actuator having one end thereof connected to the base and a weight connected to the other end of the piezoelectric actuator through a damper.

RELEVANT TECHNICAL DOCUMENTS

Patent Document

Patent Document 1: Japanese unexamined patent publication No. 2011-245437

SUMMARY

It is noted, however, that there are improvements yet to be made concerning the touch feeling feedback that returns the corresponding vibration to the finger or pen when any information is entered by the human operator, thereby allowing the human operator to have the impression that the operation has been made surely and correctly.

In light of the above problem, one object of the present invention is to provide a linear driving device that can improve the touch feeling feedback by returning the corresponding vibration to the finger or pen when any information is entered by the human operator using the finger or pen, thereby allowing the operator to have the impression that the operation has been made surely and correctly. Another object of the present invention is to provide an electronic device and a human body fitting article, both of which are equipped with such linear driving device.

In order to accomplish the first-mentioned object, the present invention provides a linear driving device which comprises:

a driving shaft moving in the axial direction thereof;

a slight rapid vibratory movements producing member coupled with one end of said driving shaft and for causing said driving shaft to be moved in said axial direction;

a casing for supporting at least either said driving shaft or said slight rapid vibratory movements producing member so that said driving shaft can be moved in said axial direction; and a moving body to be coupled with said driving shaft so that said moving body can be moved in the axial direction of said driving shaft by the movements of said driving shaft in said axial direction, wherein when said moving body moves from one end side toward the other end side of said driving shaft, a part of said moving body which forms the surface facing the other end side opposite to said one end of said moving body may hit against a component which stops said moving body from moving further toward the other end side of said driving shaft.

In order to accomplish the second-mentioned object, the present invention provides the electronic device and the human body fitting article both having the above described linear driving device integrated therein.

The desired objects can be achieved by the structures described above.

As one advantage of the present invention, it provides a linear driving device that can improve the touch feeling feedback by returning the corresponding vibration to the finger or pen when any information is entered by the human operator using the finger or pen, thereby allowing the operator to have the impression that the operation has been made surely and correctly. As another advantage of the present invention, it provides an electronic device and a human body fitting article, both of which are equipped with such linear driving device.

BRIEF DESCRIPTION OF THE DRAWINGS

FIGS. 16 (a) to (f) represent examples of how the slight rapid vibratory movements producing member is fixed to the casing as it is viewed in the downward direction.

BEST MODES OF EMBODYING THE INVENTION

Several particular embodiments of the present invention will be described below by referring to the accompanying drawings, but it should be understood that the present invention is not limited to those embodiments. Rather, the present invention may be modified in numerous ways without departing from the spirit and scope of the invention as defined in the appended claims.

Embodiment 1

The linear driving device in accordance with the embodiment 1 of the present invention will now be described by using the relevant figures in the accompanying drawings. In those relevant figures, it is assumed that the upper side of the paper corresponds to the top side (upper side) of the device while the lower side of the paper corresponds to the bottom side (lower side) of the device.

Figure 5:
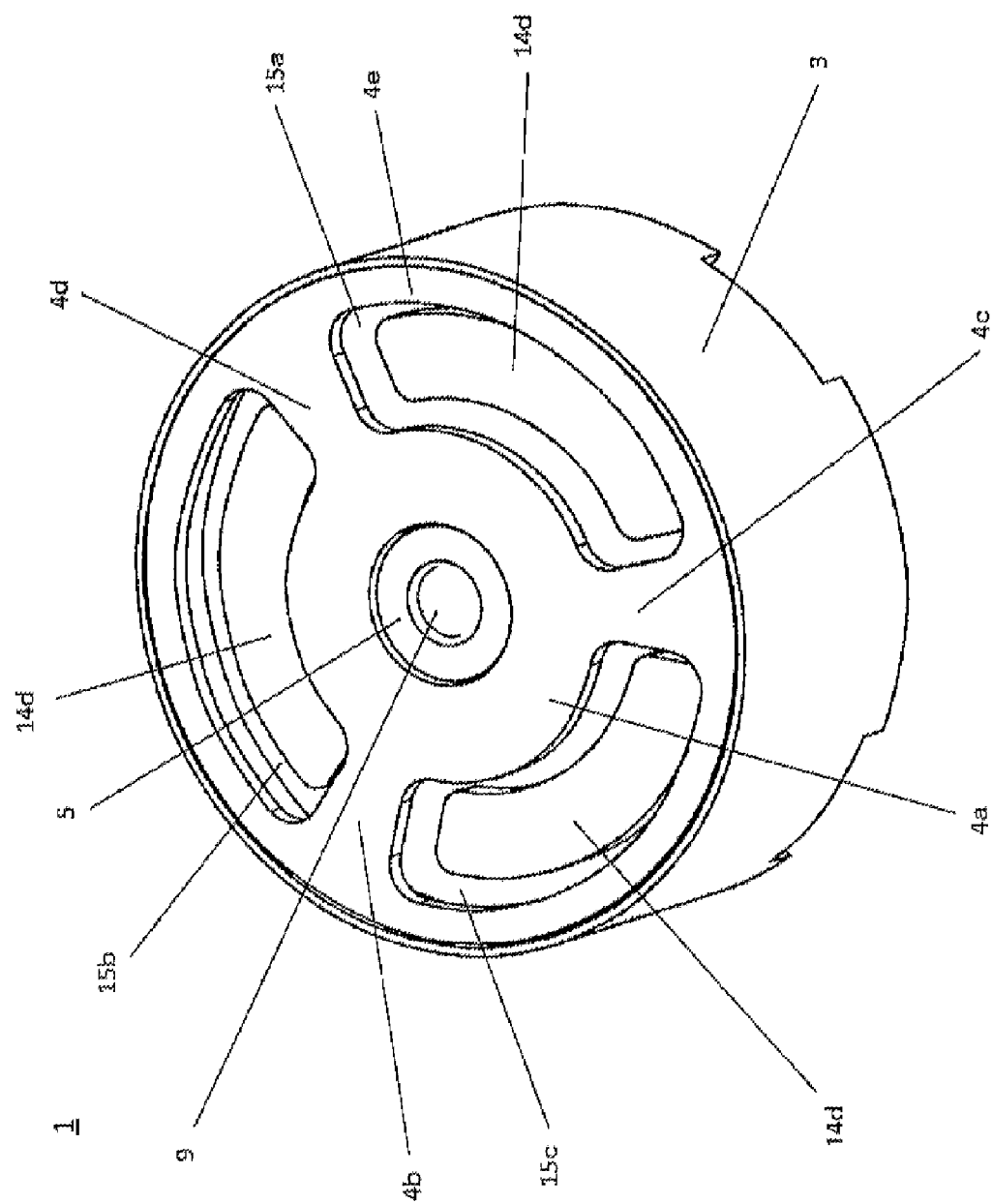
FIG. 5 is a perspective view of the linear driving device in accordance with the embodiment 1 of the present invention.
Figure 6:
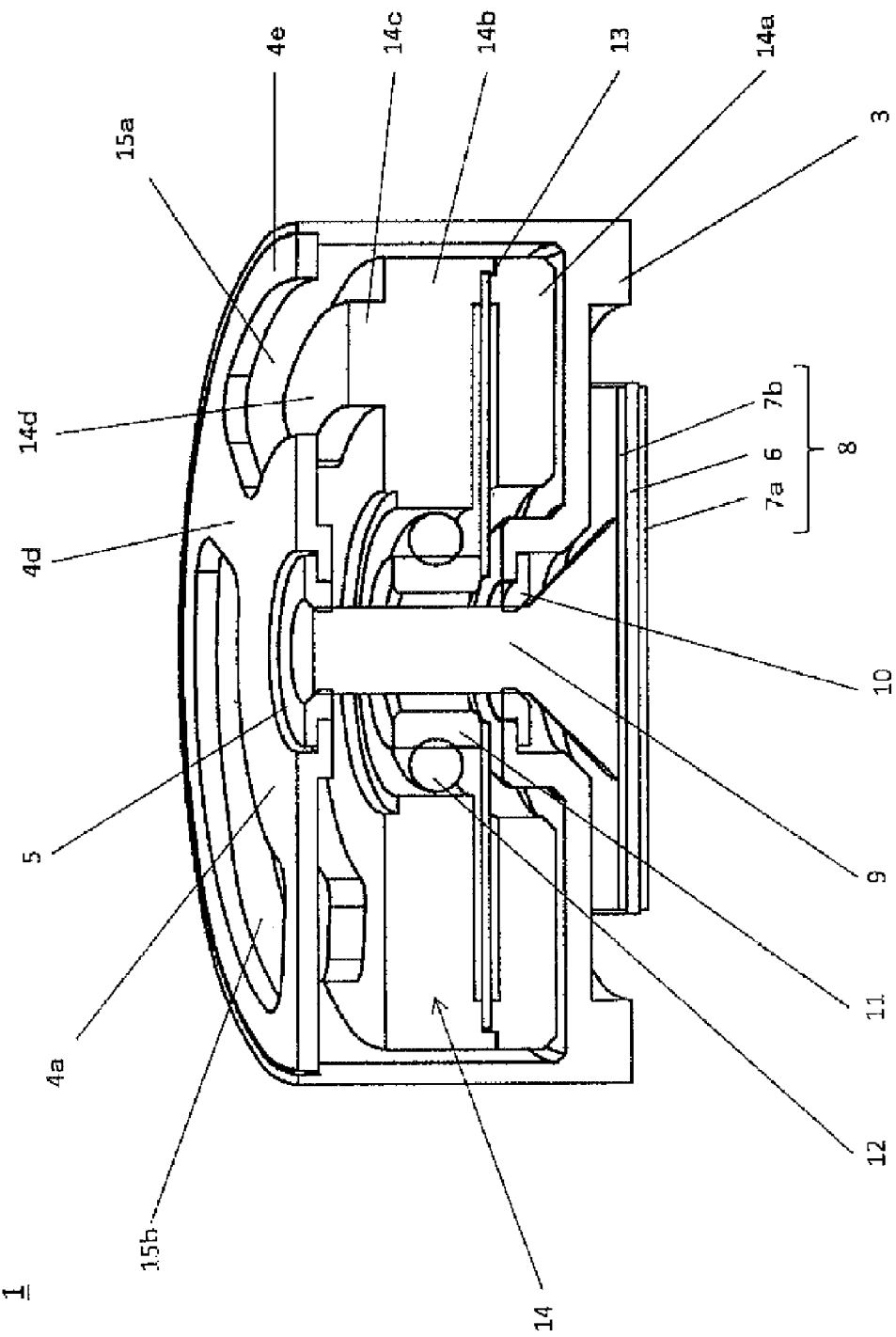
FIG. 6 is a longitudinal section view illustrating the structure of the linear driving device shown in FIG. 5 as it is viewed obliquely in the upward direction.
Figure 7:
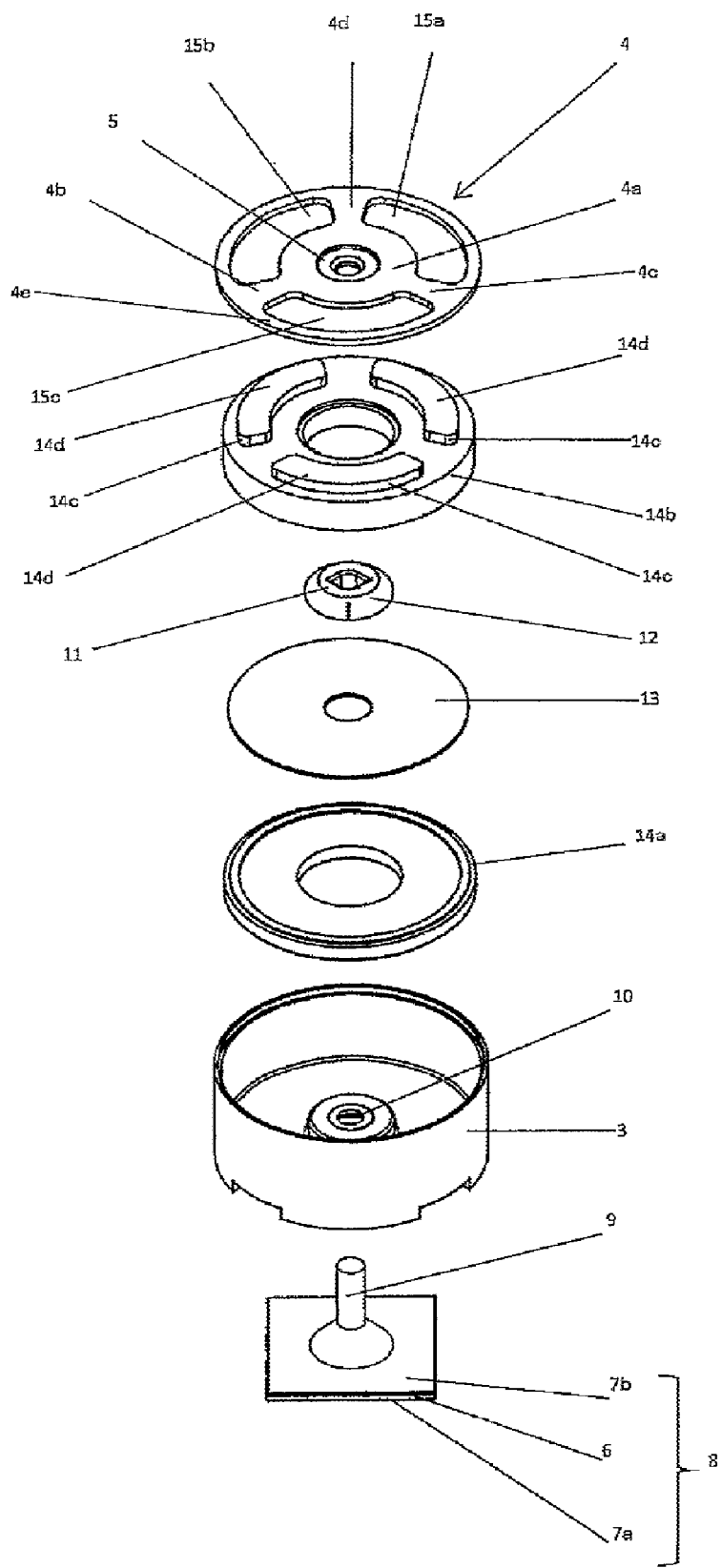
FIG. 7 is an exploded perspective view illustrating the structure of the linear driving device in accordance with the embodiment 1 of the present invention.

The linear driving device shown in FIG. 5 is designed for use with any type of an electronic device that includes a display in which the touch panel function is integrated or any type of an electronic device such as an input unit on which the operating keys are provided. Among those types of the electronic device, there is one type of electronic device in which the linear driving system-based vibration producing device is previously integrated and which enables a human operator to enter any information by depressing the appropriate keys with a finger or pen. In response to the information thus entered, the input unit will activate the linear driving system-based vibration producing device to produce the corresponding vibrations that are returned and imparted to the finger or pen, thus providing the operator with the impression that the information has been entered surely and correctly.

As shown in FIG. 1 to FIG. 7, the linear driving device 1 in accordance with the current embodiment 1 includes a driving shaft 9, a slight rapid vibratory movements producing member 8, a casing 3 and a moving body 14.

The casing 3 is provided for supporting at least either driving shaft 9 or slight rapid vibratory movements producing member 8 so that the driving shaft 9 can be moved in the axial direction thereof. In the embodiment shown and described, the casing 3 is particularly provided for supporting the driving shaft 9 in order to permit the driving shaft 9 to be moved in the axial direction thereof.

In the embodiment 1 shown in FIG. 1 to FIG. 7, the driving shaft 9 has one end, that is the lower side end, coupled with the slight rapid vibratory movements producing member 8. In the embodiment 1 shown in FIG. 1 to FIG. 7, the slight rapid vibratory movements producing member 8 is supported by the casing 8 only through the driving shaft 9 structurally.

The moving body 14 is coupled with the driving shaft 9 so that the moving body 14 can be moved in the axial direction of the driving shaft 8 by the movements of the driving shaft 8 in its axial direction. This permits the moving body 14 to move upwards and downwards alternately along the driving shaft 9 in its axial direction.

In the embodiment 1 shown in FIG. 1 to FIG. 7, the casing 3 has the tubular shape and has a cover 4 on its upper end side. The upper side surface of the cover 4 that corresponds to the upper end side of the casing 3 is provided to abut against the lower side surface 2b of the electronic device body. In the embodiment 1 in FIG. 1 to FIG. 7, the cover 4 includes an inside annular portion 4a and an outside annular portion 4e as well as three linking arms 4b, 4c, 4d for linking those annular portions. The outside annular portion 4e may be disposed on the upper end of the tubular casing 8. The linking arms 4b, 4c, 4d extend radially from the inside annular portion 4a toward the outside annular portion 4e. Cover openings 15a, 15b, 15c are provided between any two adjoining ones of the linking arms 4b, 4c, 4d.

A through hole is formed on the bottom center of casing 3. And the inside annular portion 4a of the cover 4 has the other through hole formed on the center thereof. So that, the through hole formed on the bottom center of casing 3 and the other through hole formed on the center of the inside annular portion 4a of the cover 4 are aligned. Those through holes are fitted with the respective bushings 10, 5 through which the driving shaft 9 may be inserted.

In the embodiment 1 shown and described, therefore, the through hole formed on the bottom center of the casing 3 and the other through hole formed on the center of the caver 4 are aligned with each other so that they can be vertical with respect to the bottom of the casing 3 and the cover 4.

The driving mechanism for moving the moving body 14 is implemented by the slight rapid vibratory movements producing member 8 and the driving shaft 9.

The slight rapid vibratory movements producing member 8 is made of a thin plate. Said thin plate including an elastic thin plate 6 and flexible thin plates 7a, 7b either of which is disposed on at least one side of the elastic thin plate 6. The current embodiment shown provides the bimorph form in which the flexible thin plates 7a, 7b may be fixed on the upper and lower sides of the elastic thin plate 6, respectively.

When a driving voltage is applied across the flexible thin plates 7a, 7b, it will permit the flexible thin plates 7a, 7b to expand or contract themselves, causing the central portion and the circumferential edge portion of the elastic thin plate 6, on the upper and lower sides of which the flexible thin plates 7a, 7b are fixed, to be displaced relative to each other in the normal direction of the elastic thin plate 6. The slight rapid vibratory movements producing member 8 will thus become deformed like the bowl-like shape.

The flexible thin plates 7a, 7b may be made of any suitable piezoelectric or electrostriction material having an electrode material attached to each of both sides thereof. As an example of the electrode material, it may include copper, copper alloy and the like. As an example of the piezoelectric or electrostriction material, it may include lead zirconate titanate, barium titanate, lead magnesium niobate and the like. The flexible thin plates 7a, 7b may be formed like the round shape, polygonal shape and the like.

As an example of the elastic thin plate 6, it may be made of any suitable elastic material such as copper, copper alloy and the like. Although this is not shown, the current embodiment may provide the unimorph form in which either of the flexible thin plates 7a and 7b may be disposed on one side of the elastic thin plate 6. Furthermore, it is preferred that the elastic thin plate 6 has the external shape that corresponds to that of either of the flexible thin plates 7a and 7b. This is not the requirement, however.

The flexible thin plates 7a, 7b may be rigidly fixed to the elastic thin plate 6 by means of any suitable electrically conductive adhesive agent, for example. The slight rapid vibratory movements producing member 8 has electric wires each disposed on each of both sides thereof for applying a particular voltage across the flexible thin plates 7a, 7b. Although this is not shown, those electric wires may be connected to a drive control portion.

The driving shaft 9 may be made of any of the carbon group materials having the light weight and the high rigidity, for example, and may be formed like the column shape.

The driving shaft 9 has one end thereof coupled with the slight rapid vibratory movements producing member 8. In the embodiment shown, the one end, that is the forward end, of the driving shaft 9 is fixed to the center axis of the slight rapid vibratory movements producing member 8. As an example of this fixing, the forward end of the driving shaft 9 may be fixed to the surface of the slight rapid vibratory movements producing member 8 by means of any suitable adhesive agent. In the embodiment 1 shown, that part of the driving shaft 9 which is adhesively fixed to the slight rapid vibratory movements producing member 8 is relatively fat, which means that this is due to the adhesive agent coating. The driving shaft 9 has the same size of diameter over its total length. Alternatively it may be changed to form the cross-sectional area of the forward end of the driving shaft 9 is smaller than the cross-sectional area of the other part of the driving shaft 9. Such that the forward end of the driving shaft 9 is tapered. By tapering the forward end of the driving shaft 9, that area of the slight rapid vibratory movements producing member 8 which contributes to the actual deformation can be increased.

It may be appreciated that the structure in which the forward end of the driving shaft 9 is rigidly fixed to the slight rapid vibratory movements producing member 8 may be replaced by the structure in which a through hole is provided on the slight rapid vibratory movements producing member 8 in which the lateral side of the forward end may be fixed on the inner wall of said through hole.

As described above, the driving shaft 9 is supported by the casing 3 by and through the bushings 5, 10, which are fitted in the respective through holes formed on the casing 3, so that the driving shaft 9 can be moved in its axial direction.

Those bushings 5, 10, which support the driving shaft 9, may be made of any of the elastic materials such as rubber and the like, and have respective center holes through which the driving shaft 9 can be inserted.

The bushing 5 is fitted in the through hole provided on the center of the cover 4, and is provided so that the forward end of the driving shaft 9 is fixed inside the center hole of the bushing 5 by means of the adhesive agent. The forward end of the driving shaft 9 is located on the other end side opposite to the one end side of the driving shaft 9 on which the slight rapid vibratory movements producing member 8 is fixed.

On the other hand, the bushing 10 is fitted in the through hole provided on the bottom center portion of the casing 3, and is provided so that it can only support the driving shaft 9, which is inserted into the center hole of the bushing 10, by pressing the driving shaft 9 from the outside toward the inside of the center hole of the bushing 10. That is to say, the bushing 10, which is fitted in the through hole provided on the bottom center portion of the casing 3, is not adhesively fixed on the driving shaft 9.

The structure described above permits the driving shaft 9 to be moved in its axial direction, but the driving shaft 9 itself cannot move over the long distance as the moving body 14 does.

The moving body 14 is coupled with the driving shaft 9 so that it can be moved in the axial direction by the movements of the driving shaft 9 in its axial direction.

In the current embodiment 1, the moving body 14 includes an annular support 11 coupled with the driving shaft 9 so that it can move with regard to the driving shaft 9, annular weight portions 14a, 14b provided as the separate member of the support 11, and a plate-like body 13 for linking the support 11 with the annular weight portions 14a, 14b.

The manner in which the annular support 11 is coupled so that it can move with regard to the driving shaft 9 in its axial direction may be implemented by the frictional coupling.

As the embodiment 1 of the frictional coupling, the annular support 11 may be tightened by any suitable annular tightening means 12 from the outside so that it can be frictionally coupled with the driving shaft 9.

Figure 9:
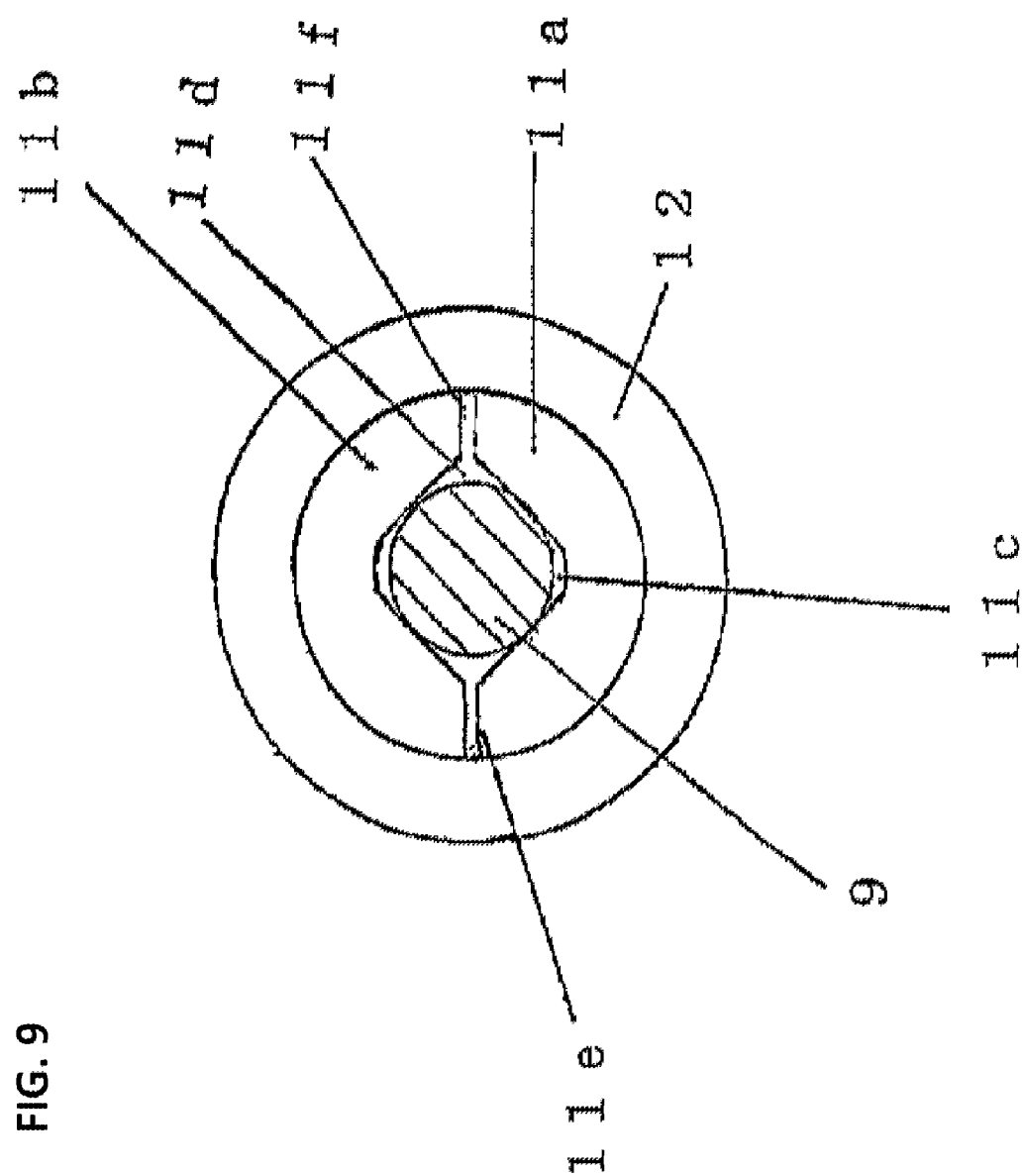
FIG. 9 is a section view illustrating one example of how the driving shaft is coupled with the support.

The embodiment shown in FIG. 9 represents one example of the frictional coupling. The annular support 11 includes two divisional parts 11a, 11b having the similar shape and that are combined together. Each of the two divisional parts 11a, 11b has an opening 11c, 11d so formed that it can correspond to the position of the driving shaft 9. Those openings 11c, 11d can accept the driving shaft 9. A gap will be created between the surface 11e of the divisional part 11a and the surface 11f of the divisional part 11b, those surfaces 11e and 11f meeting each other when the two divisional parts 11a, 11b are combined together so that the driving shaft 9 can be held securely between those divisional parts 11a and 11b. Then, the annular support 11 may be coupled with the driving shaft 9 by tightening it by the annular tightening means 12 from the outside.

The two divisional parts 11a, 11b that are combined together to form the support 11 may be made of any suitable metals such as stainless steel, for example. This can improve the durability of the support 11.

The annular tightening means 12, which may be mounted around the outer circumference of the annular support 11 and may be used to tighten the support 11 from the outer circumference toward the radial and inward direction of the center of the driving shaft 9, may be made of a coil spring, for example.

Preferably, a heat shrinkable resin material may be filled between the surfaces 11e and 11f of the divisional parts 11a, 11b meeting each other, and then the annular support 11 may be tightened by the heat shrinkable action of the heat shrinkable resin material.

Preferably, the part in which the driving shaft 9 and the support 11 contact each other may have the point-to-point contact as it is clearly seen from the cross section as shown in FIG. 9. This ensures that the stable frictional coupling can be achieved.

As the embodiment 2 of the frictional coupling, it is preferred that the support 11 may have a through hole formed on the center thereof through which the driving shaft 9 is inserted and that the heat shrinkable resin material that has been heat shrunk may be filled in the through hole.

The heat shrinkable resin material that has been filled in the through hole provides the heat shrinkable action that acts as the frictional coupling by pressing the driving shaft 9 from the outside.

The plate-like body 13 has its inner circumferential side fixed to the support 11 and has its outer circumferential side coupled with the annular weight portions 14a, 14b.

On the other circumferential side of the plate-like body 13, there are annular weight portions 14a, 14b which are fixed on the upper and lower sides, respectively.

The upper weight portion 14b has a step 14c on the upper side (the other end side opposite to the one end of the driving shaft 9) that is inserted through the openings 15a, 15b, 15c formed on the cover 4. In the embodiment shown, the upper weight portion 14b has three steps 14c, 14c, 14c. The positions of steps 14c, 14c, 14c on which they are placed on the upper side of the upper weight portion 14b correspond to each respective one of the three openings 15a, 15b, 15c formed on the cover 4 for the casing 3.

The upper side surface of the upper weight portion 14b, which comprising the moving body 14, is facing the other end side opposite to the one end of the driving shaft 9. In this embodiment, the upper side of the upper weight portion 14b is the other end side opposite to the one end of the driving shaft 9. When the upper weight portion 14b, which comprising the moving body 14, moves from one end side of the driving shaft 9 toward the other end side of the driving shaft 9, the upper weight portion 14b, which forms the surface facing the other end side opposite to said one end of the moving body 14, hits against a component which stops the upper weight portion 14b, which comprising the moving body 14, from moving further toward the other end side of the driving shaft 9. In the current embodiment, the component for stopping the moving body 14 from moving any further is represented by the lower side surface 2b of the electronic device.

In the embodiment shown in FIG. 1 to FIG. 7, the upper side surface 14d of the step 14c, which is provided on the upper weight portion 14b, hits against the component for stopping the moving body 14 from moving any further toward the other end side of the driving shaft 9. And the component for stopping the moving body 14 is the lower side surface 2b of the electronic device itself.

As an alternative structure, the openings 15a, 15b, 15c are not provided on the cover 4, and the upper side surface of the cover 4 may be allowed to abut against the lower side surface 2b of the electronic device. In this case, the component for stopping the moving body 14 is the lower side surface of the cover 4. When the upper weight portion 14b, which comprising the moving body 14, moves from one end side of the driving shaft 9 toward the other end side of the driving shaft 9, the upper weight portion 14b, which forms the surface facing the other end side opposite to said one end of the moving body 14, hits against the lower side surface of the cover 4 stopping the upper weight portion 14b, which comprising the moving body 14, from moving further toward the other end side of the driving shaft 9.

In either case, it has been described above, when the moving body 14 moves from one end side of the driving shaft 9 toward the other end side of the driving shaft 9, the upper side surface 14d of the upper weight portion 14b, which forms the surface facing the other end side opposite to said one end of the moving body 14, hits against a component which stops the moving body 14, from moving further toward the other end side of the driving shaft 9. This will produce a strong impact.

This can improve the touch feeling feedback that will be returned and imparted to the finger or pen in the form of the slight rapid vibratory movements in response to the information entered by the human operator and from which the operator can have the impression that the information has been entered surely and correctly.

For the structure in which the cover 4 having the upper side surface abutting against the lower side surface 2b of the electronic device and having the opening 15a, etc formed thereon, and the upper weight portion 14b has the step 14c, which is provided on the upper side of the upper weight portion 14b (the other end side opposite to the one end of the driving shaft 9), and is inserted through the opening 15a, etc, the step 14c may have any of the forms to be described below.

In the embodiment 1 in which the step 14c is provided on the upper weight portion 14b, at least the upper side of the step 14c will be exposed from the casing 3 at the level of the same height as the upper end side of the casing 3 when the moving body 14 has moved toward the upper side (the other end side) of the driving shaft 9.

Figure 1:
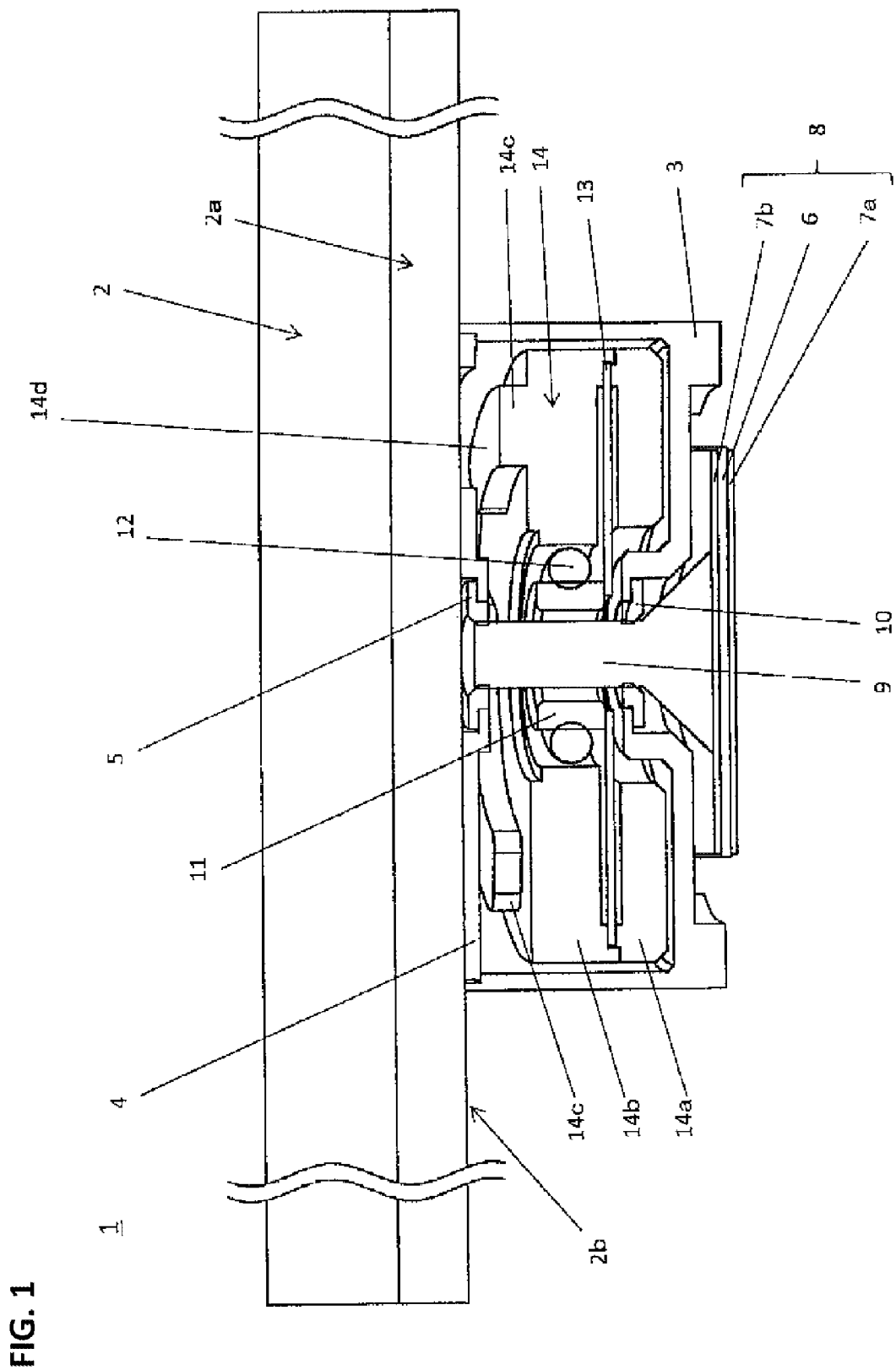
FIG. 1 is a longitudinal section view illustrating the structure of the linear driving device in accordance with the embodiment 1 of the present invention as it is viewed obliquely in the upward direction.
Figure 2:
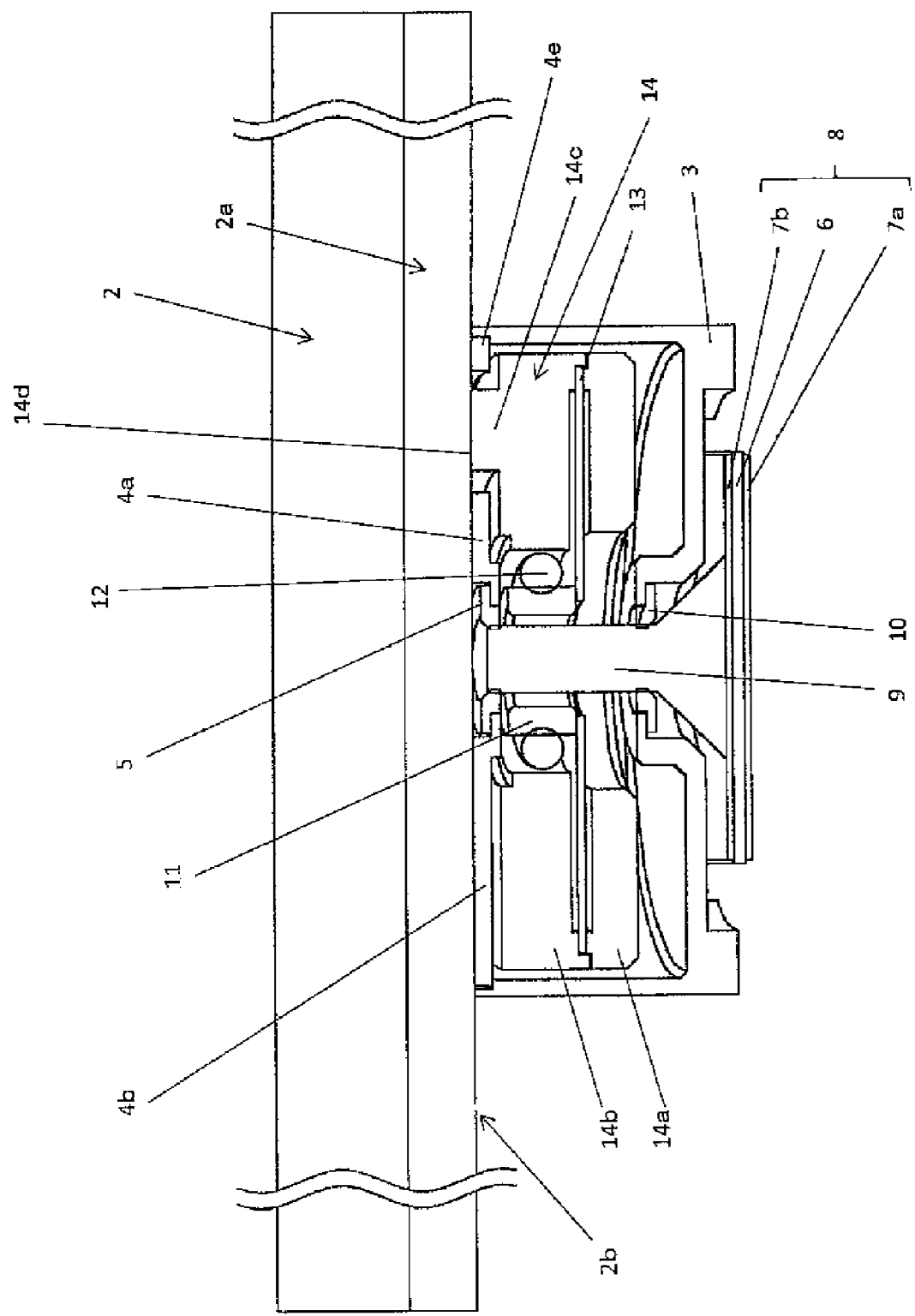
FIG. 2 is a longitudinal section view illustrating the state in which the moving body of the linear driving device shown in FIG. 1 has moved toward the upper side direction of the driving shaft as it is viewed obliquely in the upward direction.
Figure 3:
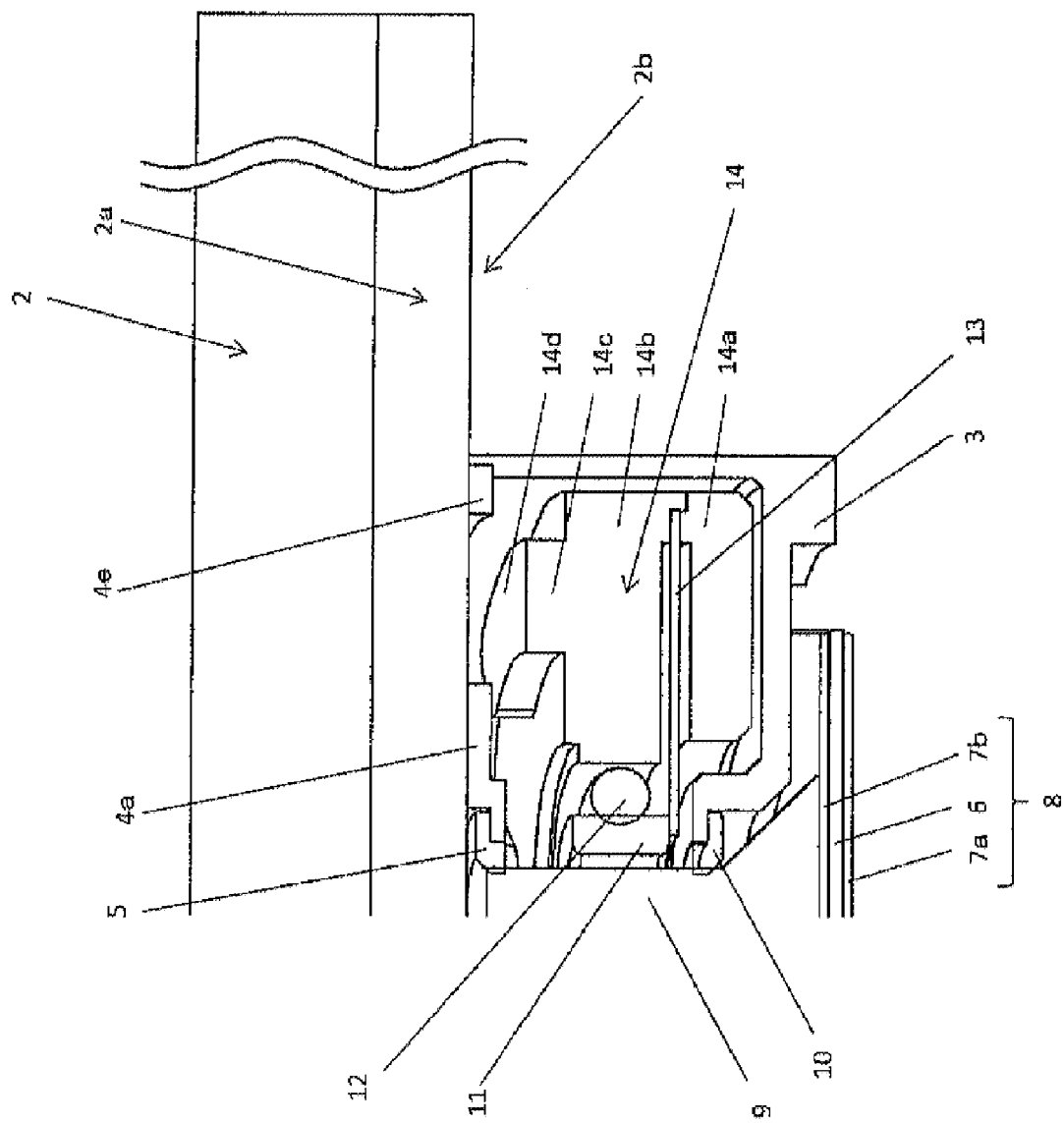
FIG. 3 is a longitudinal section view of the linear driving device of FIG. 1 as it is partly enlarged and as it is viewed obliquely in the upward direction.
Figure 4:
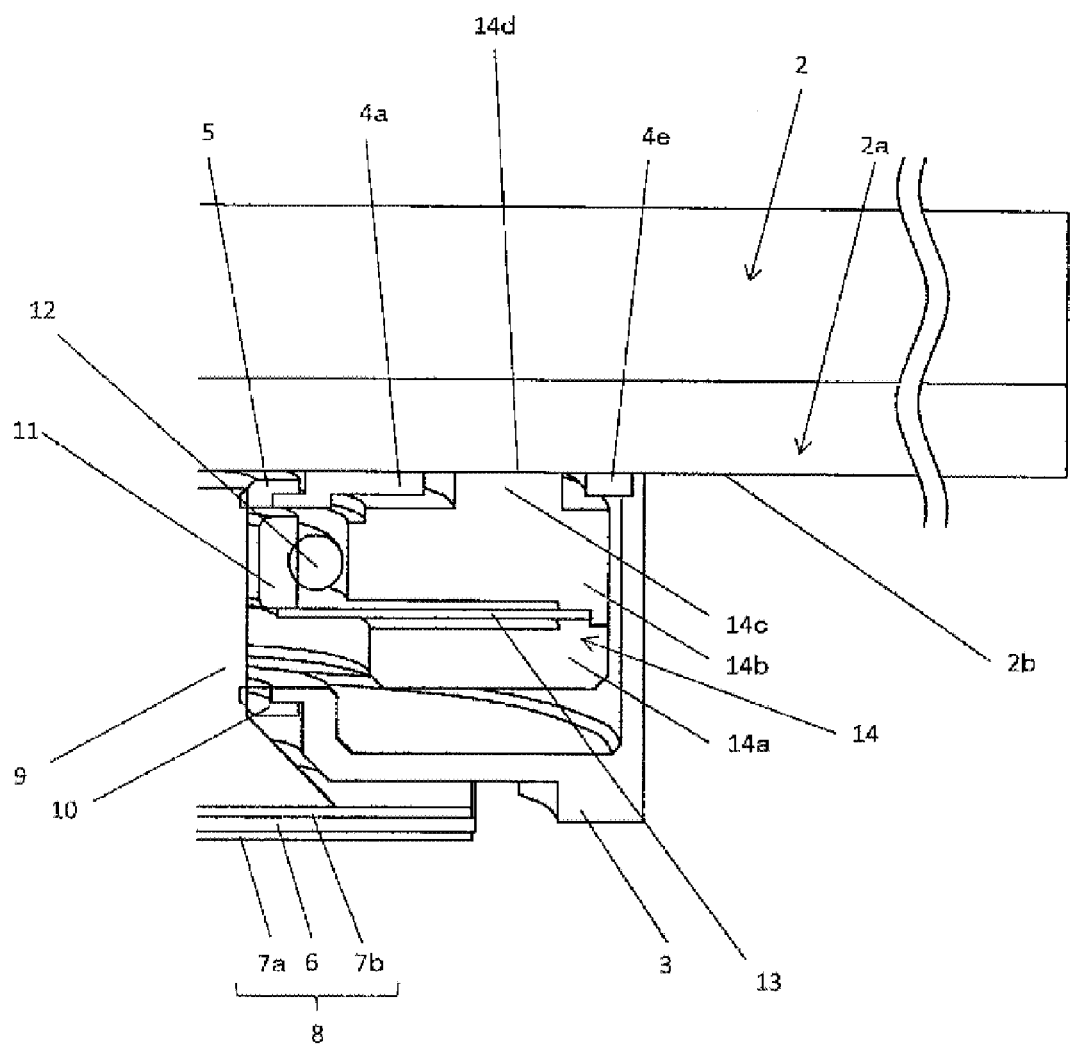
FIG. 4 is a longitudinal section view of the linear driving device of FIG. 2 as it is partly enlarged and as it is viewed obliquely in the upward direction.

In the embodiment shown, it is shown in FIG. 2 and FIG. 4 that when the moving body 14 has moved toward the upper side of the driving shaft 9, the upper side surface 14d of the step 14c has the height level that is the same as the height level of the upper side surface of the cover 4 (the surface facing the other end side opposite to the one end of the driving shaft 9).

In FIG. 2 and FIG. 4, the upper side surface of the cover 4 has the height level that is the same as the height level of the upper end side surface of the casing 3 (the surface facing the other end side opposite to the one end of the driving shaft 9). Thus, the upper side surface 14d of the step 14c can be exposed from the casing 3 at the same height level as the upper end side surface of the casing 3 (the other end side surface of the casing 3).

In the current embodiment 1 in which the lower side surface 2b of the electronic device having the linear driving device integrated therein abuts against the upper end side surface of the casing 3 as shown in FIG. 4, the height level of the upper side surface 14d of the step 14c is the same as the height level of the upper end side surface of the casing 3 as described above, thereby allowing the upper side surface 14d of the step 14c to hit against the lower side surface 2b of the electronic device.

In the linear driving device according to the current embodiment, therefore, the moving body 14 is provided, and its upper side surface can hit against the lower side surface 2b of the electronic device. This can improve the touch feeling feedback that will be returned and transmitted to the finger or pen in the form of the slight rapid vibratory movements in response to a particular operation made by the human operator and from which the operator can have the impression that the particular operation, such as entering information, has been made surely and correctly.

In the embodiment 2 in which the step 14c is provided on the upper weight portion 14b, when the moving body 14 has moved toward the upper side of the driving shaft 9, at least the upper end side of the step 14c may also be protruded from the upper end side surface of the casing 3. One example of this embodiment is that, the linear driving device 1 is not mounted on the electronic device, and when the moving body 14 is moved, at least the upper end side of the step 14c may be protruded from the upper end side of the casing 3.

In the embodiment 2 in which the step 14c is provided on the upper weight portion 14b, the touch feeling feedback can be improved further whereby it will be returned and transmitted to the finger or pen in the form of the slight rapid vibratory movements in response to a particular operation made by the human operator and from which the operator can have the impression that the particular operation has been made surely and correctly.

One example of the operation of the linear driving device 1 in accordance with the embodiment 1 is now described below.

When a driving voltage is applied across the flexible thin plate 7a forming part of the slight rapid vibratory movements producing member 8. the flexible thin plate 7a will expand itself in the direction of its thickness and contract itself in the direction of its surface, but the elastic thin plate 6 will not become deformed as such. Then, the slight rapid vibratory movements producing member 8 will become deformed such that its central portion is displaced upwardly and its circumferential edge portion is displaced downwardly. The driving voltage may have the waveforms such as the square or rectangular waveform of several ten kHz frequency, the sawtooth waveform, the triangular waveform having different rising and falling times and the like.

The driving shaft 9 whose one end is fixed on the central portion of the slight rapid vibratory movements producing member 8 is also moved upwardly and the moving body 14 coupled with the driving shaft 9 is also moved upwardly.

When the driving voltage is made to fall rapidly at the time when the slight rapid vibratory movements producing member 8 reaches its specific deformation level, the elastic action of the elastic thin plate 6 will cause the slight rapid vibratory movements producing member 8 to go back to its original (not deformed) state rapidly.

This will be followed by causing the driving shaft 9 to go back to its original position but the moving body 14 will not follow the rapid downward movement of the driving shaft 9 and remain as it is.

The result is that the moving body 14 will be moved upward slightly.

Specifically, the movement of the driving shaft 9 that reciprocates asymmetrically in this way will cause the moving body 14 to move upwardly by one to several μm on every one reciprocating movement.

As described above, this operation will be repeated at a frequency of several ten kHz.

When the moving body 14 is to be moved downward, the same driving voltage is applied across the flexible thin plate 7b forming part of the slight rapid vibratory movements producing member 8 so that the movement of the driving shaft 9 in its axial direction can be reversed. In this way, the moving body 14 will be moved upwards and downwards alternately along the driving shaft 9 in its axial direction.

When the moving body 14 is moved upwardly along the driving shaft 9 in its axial direction one or more times in this way, the upper side surface 14d of the step 14c provided on the upper weight portion 14b will hit against the lower side surface 2b of the electronic device that abuts against the upper end side surface of the casing 3. When the moving body 14 has moved upwardly along the driving shaft 9, the upper side surface 14d of the step 14c is exposed from the casing 3 at the same height level as the upper end side surface of the cover 4 or the upper end side surface of the casing 3. When the moving body 14 has moved upwardly along the driving shaft 9, otherwise, at least the upper end side surface 14d of the step 14c is protruded from the upper end side surface of the casing 3.

In the current embodiment 1, the weight portion 14b is coupled with the support 11 by way of the plate-like body 13. The upper side surface 14d of the weight portion 11b, which is coupled with the support 11 by way of the plate-like body 13, is allowed to hit against the lower side surface 2b of the electronic device. This can improve the touch feeling feedback that will be returned and transmitted to the finger or pen in the form of the slight rapid vibratory movements in response to a particular operation made by the human operator and from which the operator can have the impression that the particular operation, such as entering information, has been made surely and correctly.

It should be noted that the plate-like body 13 is not simply the plate but it may have the form of a leaf spring that can couple the weight portion 14a with the support 11 by using the arms extending radially outwardly of the support 11. In this case, the upper side surface 14d of the step 14c provided on the weight portion 14b can be forced to hit against the lower side surface 2b of the electronic device. The touch feeling feedback can be improved, therefore, whereby it will be returned and transmitted to the finger or pen in the form of the slight rapid vibratory movements in response to a particular operation made by the human operator and from which the operator can have the impression that the particular operation has been made surely and correctly.

The weight portions 14a, 14d may have the external shape such as the round, polygonal and any other shapes.

The weight portions 14a, 14b may be made of any of the materials having the great density such as the tungsten alloys. This will provide the greater mass for the same volumetric. As such, the impact of the upper side surface 14d of the step 14c on the weight portion 14b hitting against the lower side surface 2b of the electronic device can be increased. Thus, the plate-like body may made of any material having the elasticity required for elastically coupling the support 11 with the weight portions 14a, 14b. For this reason, the leaf spring may be used for the plate-like body 13.

In the embodiment shown, the weight portions 14a, 14b are fixed on the upper and lower sides of the plate-like body 13, respectively, but it is possible that only the weight portion 14b is fixed on the upper side. In the embodiment shown, the weight portions 14a, 14b are fixed on the upper and lower sides of the plate-like body 13, respectively, by considering that the great impact will be produced when the upper side surface 14d of the step 14c on the weight portion 14b hits against the lower side surface 2b of the electronic device.

Figure 8:
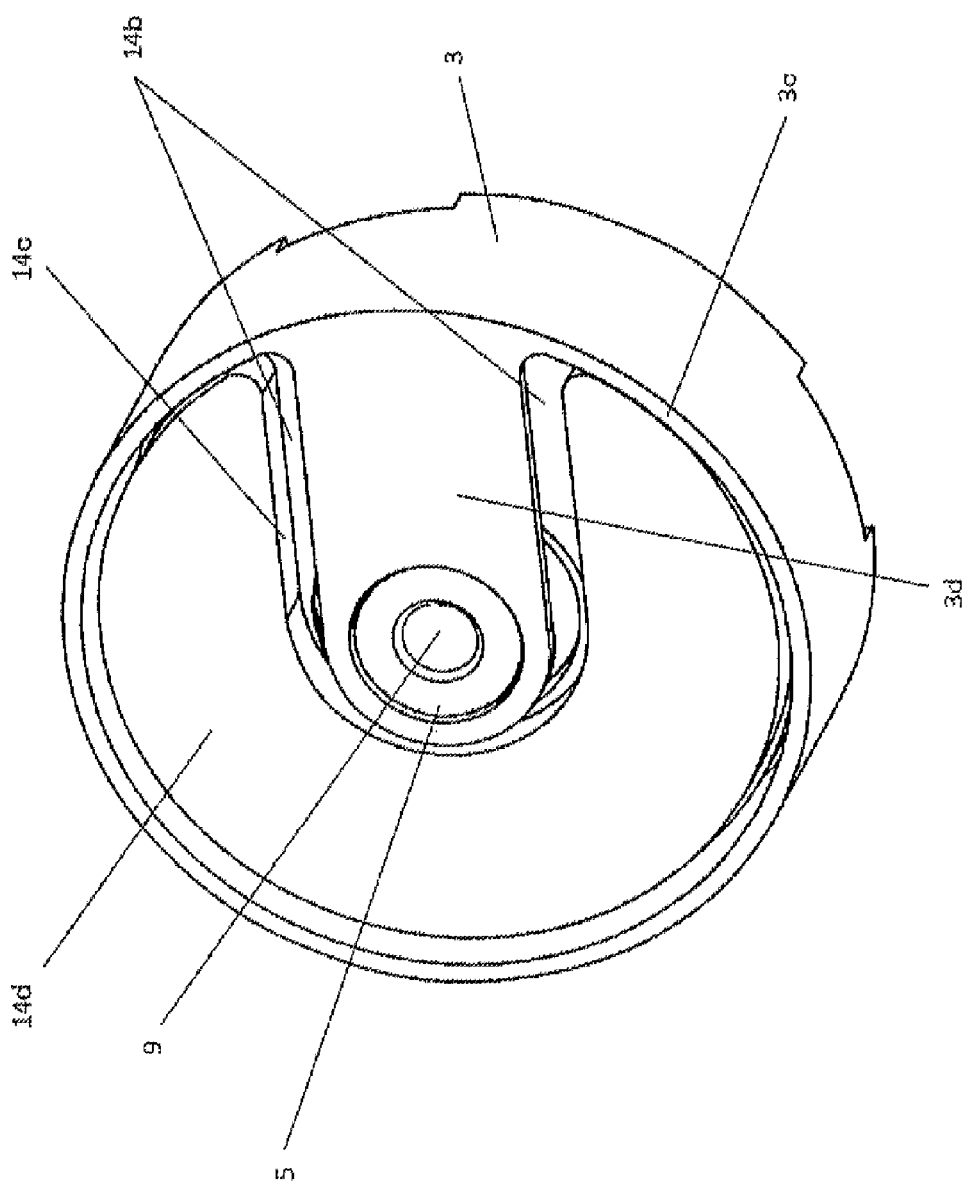
FIG. 8 is a perspective view illustrating another structure of the linear driving device in accordance with the embodiment 1 of the present invention.

According to the current embodiment 1, an impact will be produced when the upper side surface 14d of the weight portion 14b forming part of the moving body 14 hits against the lower side surface 2b of the electronic device. In the current embodiment, the cover 4 that is provided as the separate form of the casing 3 has three openings 15a to 15c formed thereon, and the upper weight portion 14b has three steps 14c that are inserted through the corresponding openings 15a to 15c. As an alternative embodiment, the cover 4 may be formed as an integral part of the casing 3 as shown in FIG. 8. In the alternative embodiment shown in FIG. 8, the casing 3 has a through hole formed at the forward end of the linking arm 3d extending from the upper outside annular portion 3c toward the center thereof, and the driving shaft 9 is inserted into the through hole by way of the bushing 5 fitted inside the through hole. The upper side surface 14d provided on the upper weight portion 14b is formed on the step 14c of the weight portion 14b except for the area on which the linking arm 3d of the casing 3 is provided.

In the current embodiment 1, the moving body 14 includes the support 11 and the weight portions 14a, 14b in which the support 11 and the weight portions 14a, 14b are provided separately from each other and are linked by the plate-like body 13. Alternatively, the moving body 14 may be divided into several divisional parts as such as the support 11, and the moving body 14 may be frictionally coupled with the driving shaft 9 by tightening it by using the annular tightening means.

In the current embodiment 1, the slight rapid vibratory movements producing member 8 is provided in the form of the plate having the so-called bimorph or unimorph. Alternatively, it may be provided in the form of the integration type. In this case, only the slight rapid vibratory movements producing member may be supported by the casing 3.

Embodiment 2

Figure 10:
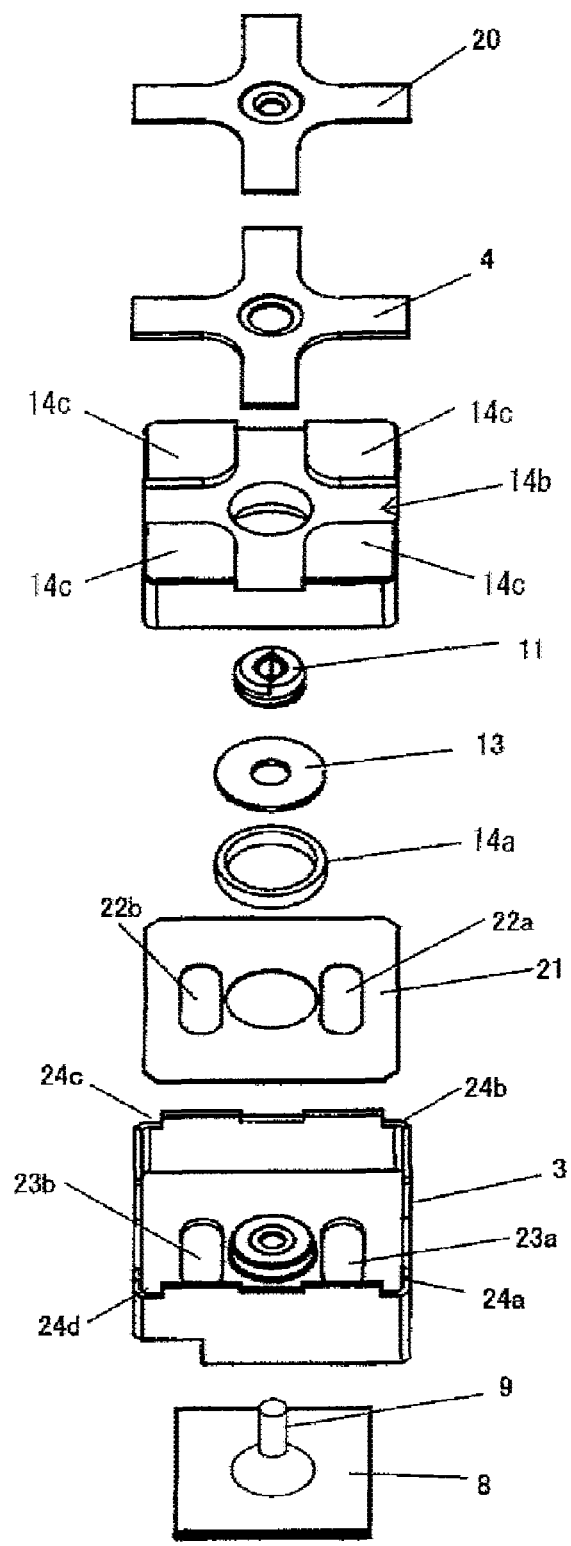
FIG. 10 is an exploded perspective view illustrating the structure of the linear driving device in accordance with the embodiment 2 of the present invention.
Figure 11:
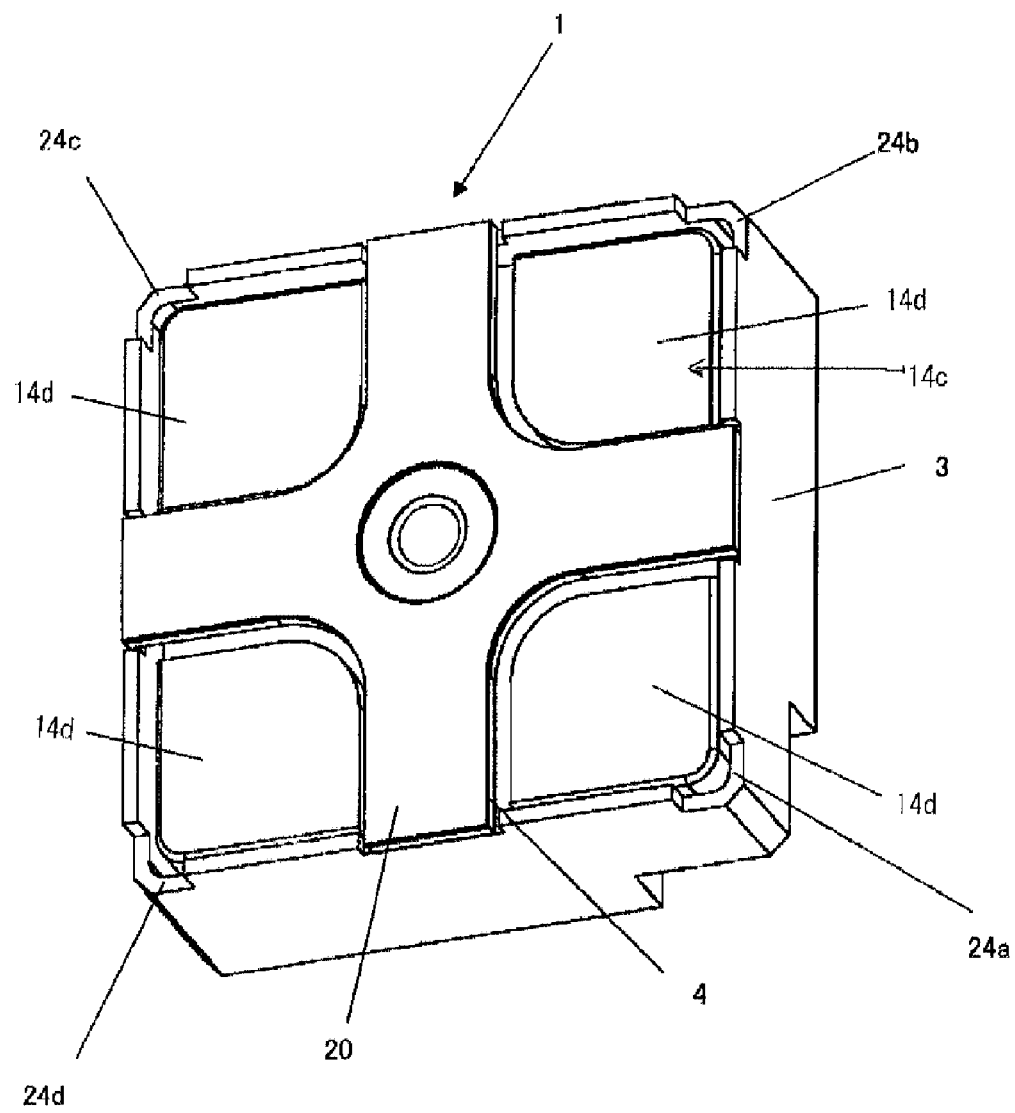
FIG. 11 is a perspective view illustrating the linear driving device shown in FIG. 10.

The embodiment 2 and some variations thereof that can be applied to the present invention will now be described by using FIG. 10 to FIG. 12.

The component parts or elements that are similar to those in the embodiment 1 that have been described by using FIG. 1 to FIG. 8 are given like reference numerals and the description of those component parts or elements is omitted to avoid the duplicate description.

In the embodiment shown, the weight portion 14b forming part of the moving body 14 has a step 14c formed at each of the four corners. On the upper end side of the casing 3, on the other hand, a cover 4 having the cross-like shape as it is viewed in plane is disposed. On the upper side of the cover 4, a double-sided tape 20 is attached and the linear driving device 1 is mounted to the lower side surface 2b of the electronic device by means of the double-sided tape 20. When the upper side surface 14d of the step 14c hits against the lower side surface 2b of the electronic device, the cover 4 will be fitted into the groove formed between the four steps 14c.

Like the embodiment 1, the linear driving device 1 in accordance with the current embodiment 2 will also permit the moving body 14 to move upwards and downwards alternately along the driving shaft 9 in its axial direction. After the moving body 14 has moved toward the upward direction of the driving shaft 9 and hits against the lower side surface 2b of the electronic device, there is the risk that the lower side of the moving body 14 might hit against the bottom surface of the casing 3. This might produce any unwanted impact sound.

In the embodiment 2, a sound proofing material 21 is provided on the bottom surface of the casing 3. By providing the sound proofing material 21 on the bottom surface of the casing 3 that is located on the surface opposite to the lower end side surface of the moving body 14, any unwanted impact sound that otherwise might be produced can be avoided. The lower end side surface of the moving body 14 is the end side surface which is facing the lower end side of the driving shaft 9.

The sound proofing material 21 is provided for avoiding the impact sound that might be produced when the lower side of the moving body 14 hits against the bottom surface of the casing 3 while the moving body 14 is moving toward the downward direction of the driving shaft 9. For this purpose, the sound proofing material 21 is provided such that it can be held between the lower side surface of the moving body 14 and the bottom surface of the casing 3.

As an alternative variation of the form in which the sound proofing material 21 is provided on the bottom surface of the casing 3, the sound proofing material 21 may be provided on the lower side surface of the moving body 14, more specifically, on the lower side surface of the lower weight portion 14b in FIG. 9. Also, the sound proofing material 21 may be provided both on the bottom surface of the casing 3 and on the lower side surface of the moving body 14, more specifically, on the lower side surface of the lower weight portion 14b in FIG. 9.

The sound proofing material 21 may be made of any material that can meet the object described above. For example, it may be made of the sheet-like material having the thickness of about 0.1 mm such as the synthetic resin material including polyethylene terephthalate.

It is noted from the current embodiment 2 that an air gap is provided through which the air can flow from the inside to the outside of the casing 3 or vice versa In the structure in which there is no air gap that communicates between the inside and the outside of the casing 3, the air cannot escape from the inside to the outside of the casing 3 when the moving body 14 is moving upwards and downwards alternately along the driving shaft 9. This will create the air resistance against the moving body 14 during its reciprocating movement. This air resistance will have the effect of reducing the speed of the moving body 14 during its reciprocating movement, causing the impact to be reduced accordingly when the moving body 14 is moving toward the upward direction of the driving shaft 9 and then hits against the lower side surface 2b of the electronic device.

It is apparent from the embodiment 2 that the casing 3 includes the air gap through which the inside and the outside of the casing 3 communicate with each other. This permits the air to flow from the inside to the outside of the casing 3 or vice versa when the moving body 14 is going upwardly and downwardly. As compared with the structure in which there is no such air gap communicating between the inside and the outside of the casing 3, the structure according to the current embodiment 2 is such that the air resistance against the moving body 14 that will created during its reciprocating movement can be reduced. For this reason, the reduction of the moving speed that may be caused by the air resistance while the moving body 14 is moving can be smaller. The impact that will be caused by the moving body 14 hitting against the lower side surface 2b of the electronic device can be greater accordingly, and this can improve the touch feeling feedback that will be returned and transmitted to the finger or pen in the form of the slight rapid vibratory movements in response to a particular operation made by the human operator and from which the operator can have the impression that the particular operation has been made surely and correctly.

It is apparent from the embodiment shown that the air gap through which the air can flow from the inside to the outside of the casing 3 or vice versa may be implemented by the through holes 23a, 23b formed on the bottom surface of the casing 3 and the notches 24a, 24b, 24c, 24d provided on the upper side of the casing 3. For the notches 24a to 24d, they will act as the air gap through which the air can flow from the inside to the outside of the casing 3 or vice versa when the upper end side surface of the casing 3 and the lower side surface 2b of the electronic device are combined.

Figure 12A:
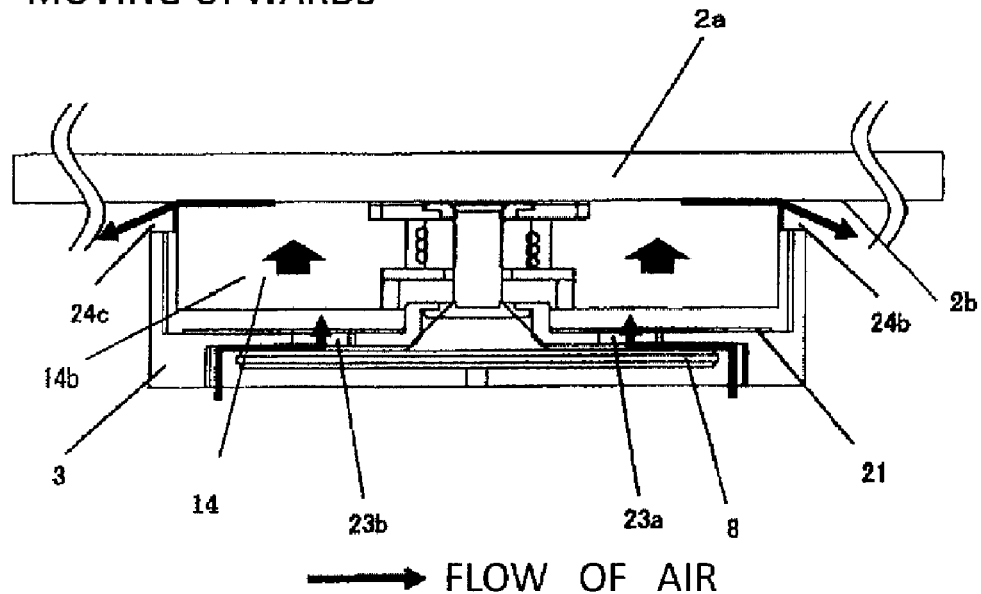
FIGS. 12 (a) and (b) illustrate how the air flows inside and outside the casing at the time when the moving body of the linear driving device shown in FIG. 10 is moving upwardly and downwardly.
Figure 12B:
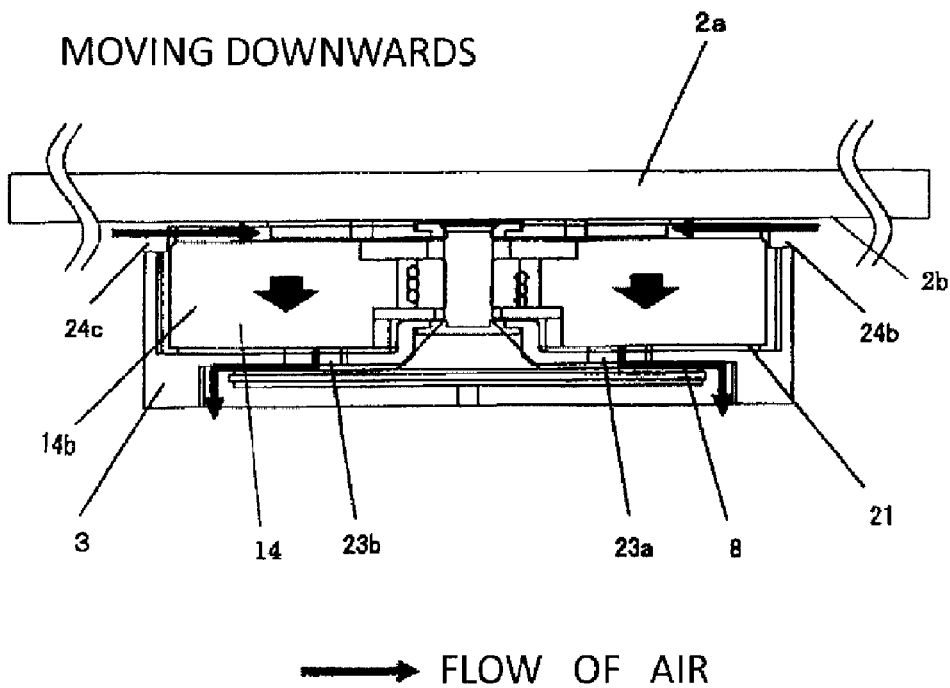

As shown in FIG. 12 (a), the air will flow between the inside and the outside of the casing 3 as indicated by the arrow when the moving body 14 moves toward the upward direction. Specifically, the air that exists in the space between the upper surface of the moving body 14 and the lower side surface 2b of the electronic device will pass through the notches 24a to 24d, flowing smoothly out of the casing 3. Conversely, the air will pass through the through holes 23a, 23b and flows smoothly from the outside of the casing 3 into the space between the lower surface of the moving body 14 and the bottom surface of the casing 3. This permits the moving body 14 to hit against the lower side surface 2b of the electronic device without reducing its speed due to the air resistance.

As shown in FIG. 12 (*b*), the air will flow between the inside and the outside of the casing 3 when the moving body 14 moves toward the downward direction as indicated by the arrow. Specifically, the air that exists in the space between the lower surface of the moving body 14 and the bottom surface of the casing 3 will pass through the notches 24a to 24d, flowing smoothly out of the casing 3. Conversely, the air will pass through the through holes 23a, 23b, flowing smoothly from the outside of the casing 3 into the space between the upper surface of the moving body 14 and the lower side surface 2b of the electronic device. This permits the moving body 14 to move downwardly without reducing its moving speed due to the air resistance. By switching the driving voltage in the manner described in the embodiment 1, the moving body 14 can move upwards and downwards alternately without reducing its moving speed due to the air resistance.

For the case in which the air gap is provided on the casing 3 for allowing the air to flow from the inside to the outside of the casing 3 or vice versa, moving body 14 will be able to move upwards and downwards alternately without being affected greatly by the air resistance.

When the moving body 14 moves toward the downward direction and then hits against the bottom surface of the casing 3, therefore, the moving body 14 will also be able to hit against the casing 3 without being affected greatly by the air resistance.

For the structure in which the air gap is provided on the casing 3 for allowing the air to flow from the inside to the outside of the casing 3 or vice versa, it is particularly preferred that the sound proofing material 21 is disposed such that it can be held between the lower side surface of the moving body 14 and the bottom surface of the casing 3. In this case, it is preferred that through holes 22a, 22b for allowing the air to escape are provided on the sound proofing material 21 and that they can have the position and form that correspond to those of the through holes 23a, 23b formed on the bottom surface of the casing 3. This will allow the air to flow from the inside to the outside of the casing 3 or vice versa, depending on whether the moving body 14 is moving toward the upward or downward direction as shown in FIG. 11 and regardless of whether the sound proofing material 21 is provided or not.

It may be understood from the above description that the air gap that allows the air to flow between the inside and the outside of the casing 3 is provided for the purpose of reducing the air resistance that may be created when the moving body 14 including the weight portions 14a, 14b is moving upwards and downwards alternately along the driving shaft 9. The through holes 23a, 23b and the notches 24a to 24d described above are not limitative, but any type or form that can meet the above purpose may be used.

Furthermore, the moving body 14 itself may have the mechanical function of the reducing the air resistance. For example, the moving body 14 may be structured such that a through hole is formed on the flat portion of the upper side surface 14d so that it can extend from the upper surface to the lower surface of the weight portion 14a and/or 14b forming the moving body 14 and that an air escape hole is formed on the moving body 14 for allowing the air to pass from the upward to the downward direction. The moving body 14 may also be structured such that an air escape groove is formed on the outer circumferential surface of the weight portion 14a and/or 14b forming the moving body 14 so that it can extend from the upper surface to the lower surface in the upward and downward directions and that the air is allowed to escape in the upward and downward directions through this air escape groove.

The air escape hole and the air escape groove are provided for allowing the air to flow smoothly between the space that exists between the upper surface of the moving body 14 and the lower side surface 2b of the electronic device and the space that exists between the lower surface of the moving body 14 and the bottom surface of the casing 3. This will permit the moving body 14 to move upwards and backwards alternately without being affected greatly by the air resistance.

Embodiment 3

Figure 13:
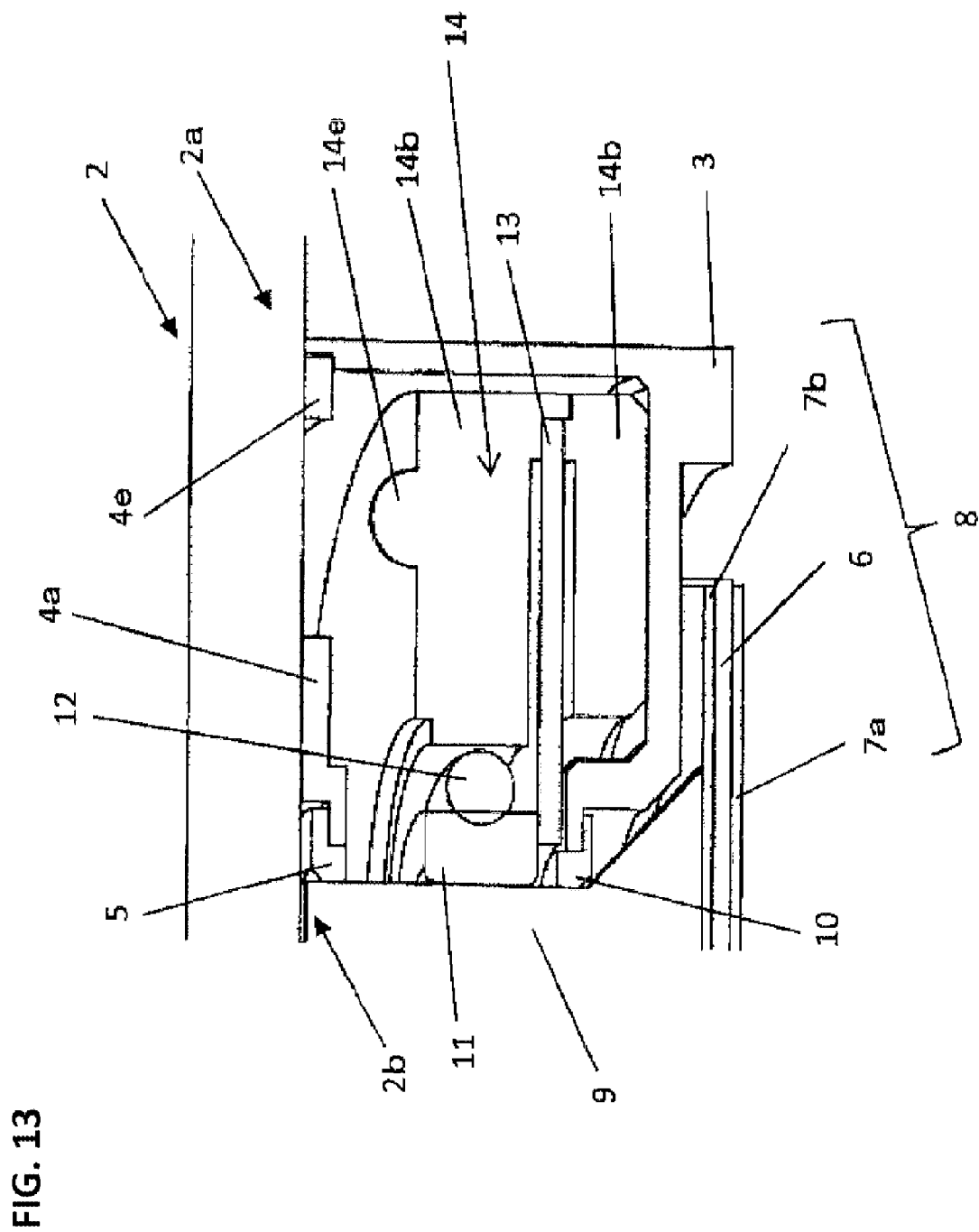
FIG. 13 is a longitudinal section view illustrating the structure of the linear driving device in accordance with the embodiment 3 of the present invention as it is viewed obliquely in the upward direction although some parts are omitted.

Another embodiment that can be applied to the present invention will now be described by using FIG. 13 to FIG. 15.

The component parts or elements that are similar to those in the embodiments 1 and 2 that have been described by using FIG. 1 to FIG. 12 are given like reference numerals, and the description of those component parts or elements is omitted to avoid the duplicate description.

In the embodiments 1 and 2, the upper weight portion 14b includes the steps 14c formed on the upper side (the other end side opposite to the one end of the driving shaft 9) and which are passed through the corresponding openings 15a, 15b, 15c formed on the cover 3.

In the current embodiment 3, instead of the steps 14c in the embodiments 1 and 2, the upper weight portion 14b includes protruded portions 14e provided on the upper side (the other end side opposite to the one end of the driving shaft 9). In the form shown, a total of three protruded portions 14e are provided such that each can correspond to each respective one of the three openings 15a, 15b, 15c formed on the cover 4 for the casing 3.

In the current embodiment 3, when the moving body 14 moves from one end side of the driving shaft 9 toward the other end side of the driving shaft 9, the protruded portions 14e hits against a component which stops the upper weight portion 14b. That is to say, the portion which forms the surface facing the other end side opposite to the one end (lower end) of the moving body 14 is the protruded portions 14e.

Figure 14:
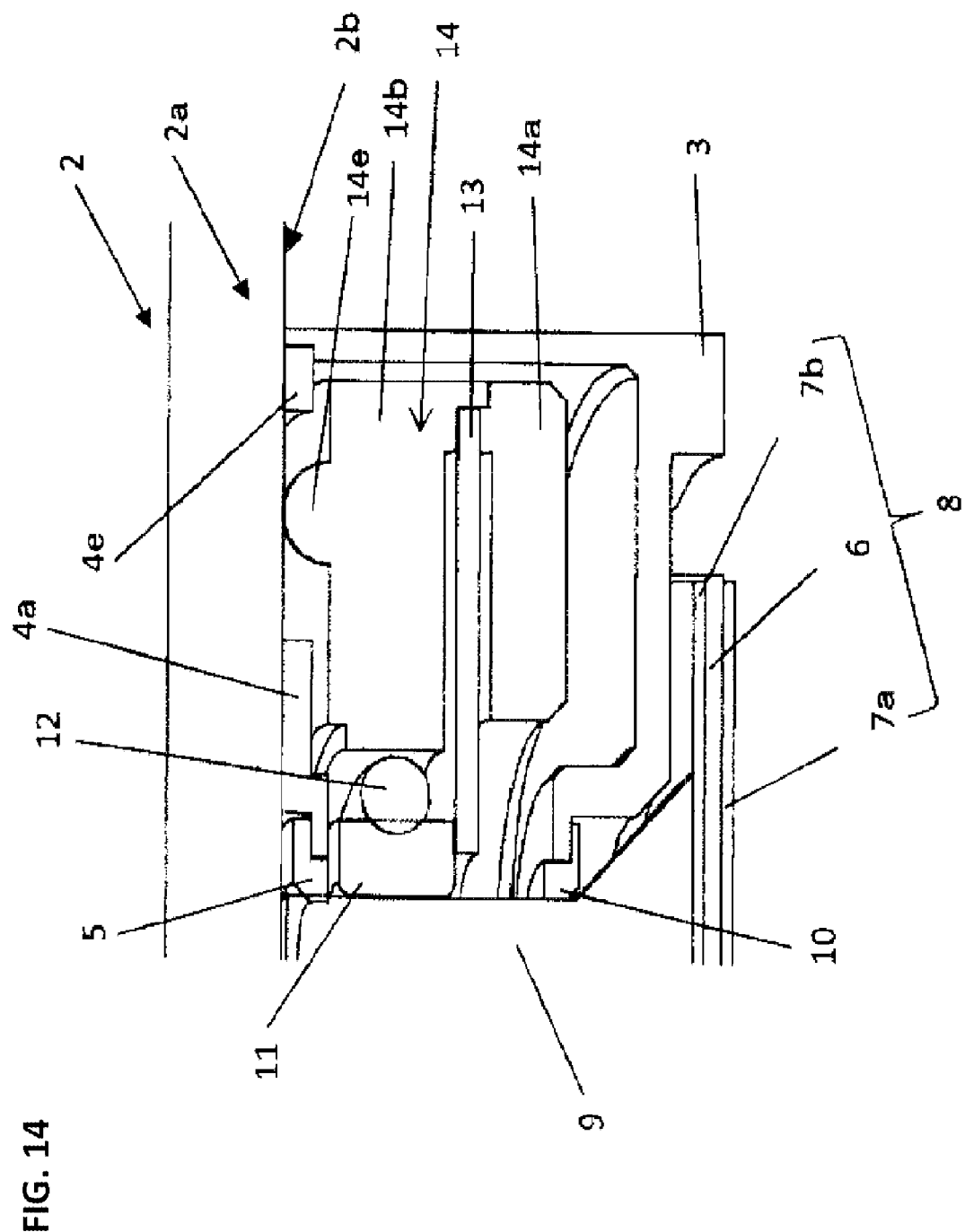
FIG. 14 is a longitudinal section view illustrating the state in which the moving body of the linear driving device shown in FIG. 13 has moved toward the upper side of the driving shaft as it is viewed obliquely in the upward direction.
Figure 15:
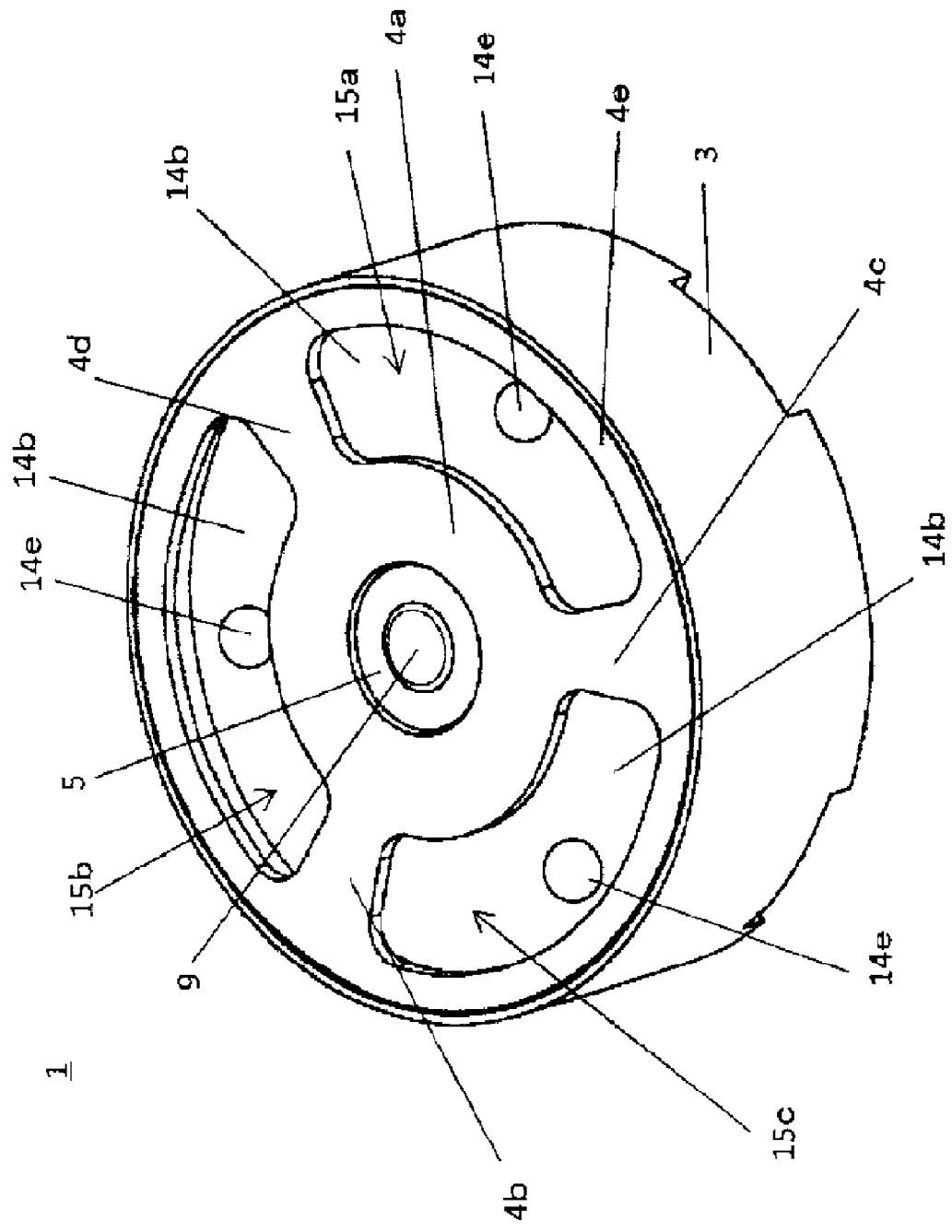
FIG. 15 is a perspective view illustrating the linear driving device in accordance with the embodiment 3 of the present invention.

In the current embodiment 3, when the moving body 14 has moved from the one end side toward the other end side of the driving shaft 9, it will hit against the member for stopping the moving body 14 from moving any further as shown in FIG. 14. Specifically, this hitting occurs at the points (the tops of the protruded portions 14e) against the stopping member (such as the lower side surface 2b of the electronic device). This point hitting can improve the touch feeling feedback that will be returned and transmitted to the finger or pen in the form of the slight rapid vibratory movements in response to a particular operation made by the human operator and from which the operator can have the impression that the particular operation has been made surely and correctly.

Like the embodiments 1 and 2, the current embodiment 3 may also be structured such that when the moving body 14 has moved toward the other end side of the driving shaft 9, that part of the moving body 14 which forms the surface facing the other end side opposite to the one end, more specifically the forward end (top) of the protruded portion 14e on the other end side will be exposed from the casing 3 at the same height level as the end of the casing 3 on the other end side or will be projected from the end of the casing 3 on the other end side.

It is preferred that the protruded portion 14e may be formed so that the upper end side itself of the upper weight portion 14b can be raised upwardly. It is also preferred that a semi-global form may be provided on the upper end side of the upper weight portion 14b by means of any suitable adhesive agent. Furthermore, it is preferred that a depressed portion may be provided on the upper end side of the upper weight portion 14b, and a global form may be provided adhesively on the depressed portion. Those can be provided in any possible way.

The operation and function of the current embodiment 3 are similar to those in the embodiments 1 and 2 described above except that the protruded portion 14e is provided in place of the step 14c and that the member for stopping the moving body 14 from moving any further (such as the lower side surface 2b of the electronic device) is hit against at the points (that is, the tops of the protruded portions 14e). Thus, the description of the operation and function which are similar to those in the embodiments 1 and 2 is omitted to avoid the duplicate description.

Embodiment 4

In the embodiments 1, 2, and 3 shown in FIG. 1 to FIG. 15, the structure is such that the lower end of the driving shaft 9 is coupled with the slight rapid vibratory movements producing member 8 which is supported by the casing 3 only through the driving shaft 9.

In the current embodiment 4 shown in FIG. 16, however, the slight rapid vibratory movements producing member 8 is rigidly fixed to the casing 3 so that its circumferential edge portion is fixed to the casing 3 at the points arranged at equal intervals in its circumferential direction. As described in the embodiment 1, the slight rapid vibratory movements producing member 8 takes the thin plate form including the elastic thin plate 6 and the flexible thin plates 7a, 7b each of which is disposed at least one side of the elastic thin plate 6. The thin plate will become deformed like the bowl shape when the driving voltage is applied across the flexible thin plates 7a, 7b.

In the embodiment shown in FIG. 16 (a), the casing 3 has the triangular shape as it is viewed in plane, and the slight rapid vibratory movements producing member 8 has the round shape as it is viewed in plane.

The casing 3 includes the tubular portion whose lower end portion 3a has the inner circumferential edge that is provided higher by one step than the outer circumferential edge, and the lower end portion 3a serves as the fixing portion 3b for the slight rapid vibratory movements producing member 8.

The slight rapid vibratory movements producing member 8 has its circumferential edge portion 8a fixed to the fixing portion 3b of the casing 3 at the points (small areas).

In the embodiment shown in FIG. 16 (a), the casing 3 has the square shape as it is viewed in the downward direction, and the slight rapid vibratory movements producing member 8 has the round shape that allows the slight rapid vibratory movements producing member 8 to rest just on the fixing portion 3b of the casing 3 at the four points around its circumferential edge portion 8a.

By forming the elastic thin plate 6 so that it can extend outwardly of the flexible thin plates 7a, 7b, the circumferential edge portion 8a can be so formed as to allow the slight rapid vibratory movements producing member 8 to be fixed to the fixing portion 3b of the casing 3 at the four points thereof. The circumferential edge portion 8a may be provided by extending any one of the flexible thin plates 7a, 7b and elastic thin plate 6 outwardly that is fixed to the fixing portion 3b of the casing 3. This permits the electric wires to be disposed easily.

The slight rapid vibratory movements producing member 8 is directly fixed to the casing 3, which permits the slight rapid vibratory movements producing member 8 to provide the stable driving force. Furthermore, the slight rapid vibratory movements producing member 8 may be fixed to the casing 3 not around its circumferential edge portion 8a but at the four points thereof. Thus, the slight rapid vibration producing member 8 can provide the slight rapid vibrations without being absorbed by the casing 3, and the deformation that otherwise might be hindered from occurring can be limited to the allowable level. Thus, the slight rapid vibratory movements producing member 8 can provide the great driving force. It is thus possible to move the weight portions 14a, 14 that are heavier than those in the embodiment 1.

It should be noted that the lower end portion 3a serves as the fixing portion 3b of the casing 3 whose inner circumferential edge is located higher by one step than the outer circumferential edge. By providing the step of the fixing portion 3b more deeply than the thickness of the slight rapid vibratory movements producing member 8, the slight rapid vibratory movements producing member 8 can be enclosed by the casing 3 without being protruded through the lower end portion 3a of the casing 3. This can protect the linear driving device 1 against any possible destruction by the external force during and after its assembling process.

In the current embodiment 4, it should be noted that any other combinations of the respective forms of the casing 3 and the slight rapid vibratory movements producing member 8 than those described above are possible.

For example, the casing 3 may have the round shape and the slight rapid vibratory movements producing member 8 may have the square shape as opposed to those shown in FIG. 16 (a).

FIG. 16 (c) shows that both the casing 3 and the slight rapid vibratory movements producing member 8 have the square shape. In this case, the slight rapid vibratory movements producing member 8 has the square shape having the corners around its circumferential edge portion 8a and the casing 3 has the square shape having the corresponding corners. Thus, the circumferential edge portion 8a of the slight rapid vibratory movements producing member 8 can rest on the fixing portion 3b of the casing 3.

FIG. 16 (d) shows that the casing 3 has the octagonal shape and the slight rapid vibratory movements producing member 8 has the square shape.

The octagonal shape of the casing 3 may be obtained by chamfering the corners of the casing 3 of the square shape shown in FIG. 16 (c). The casing 3 may be thought to have the rounded square shape rather than the octagonal shape.

FIG. 16 (e) shows that the slight rapid vibratory movements producing member 8 in FIG. 16 (d) has the round shape.

FIG. 16 (f) shows that slight rapid vibratory movements producing member 8 has the hexagonal shape rather than the round or square shape. This shape may be preferred.

It is apparent from the above that the casing 3 and the slight rapid vibratory movements producing member 8 may have any combinations of their respective forms It may be appreciated from the embodiment 4 that the form in which the slight rapid vibratory movements producing member 8 is fixed to the casing 3 at the points arranged at equal intervals around the circumferential edge portion in the circumferential direction is not limited to the structure in which the moving body 14 has the protruded portion 15 formed on the upper end portion thereof (the surface facing the other end side opposite to the one end of the driving shaft 9).

For example, this form may be applied to the structure in which the moving body 14 has no such protruded portion formed on the upper end side thereof. This application can be made without causing any problems. An example of the moving body 14 that is structured as described above is the lens support and the like on which a lens is mounted, in which case the linear driving device works as the lens driving device.

Embodiment 5

In the embodiment described above, the form in which the moving body 14 is allowed to hit against the lower end surface 2b of the electronic device or the form in which the moving body 14 is allowed to hit against the lower side surface of the cover 4 for the casing 3 has been described.

In the current embodiment 5 to be described below, by controlling the driving voltage to be applied to the slight rapid vibratory producing member 8, the switching may be made between the form in which the moving body 14 in its first mode is allowed to hit against the lower side surface 2b of the electronic device, etc, and the form in which the moving body 14 in its second mode is allowed to move upwards and downwards alternately along the driving shaft 9 in its axial direction without hitting against the lower end side 2b of the electronic device, etc.

Figure 17:
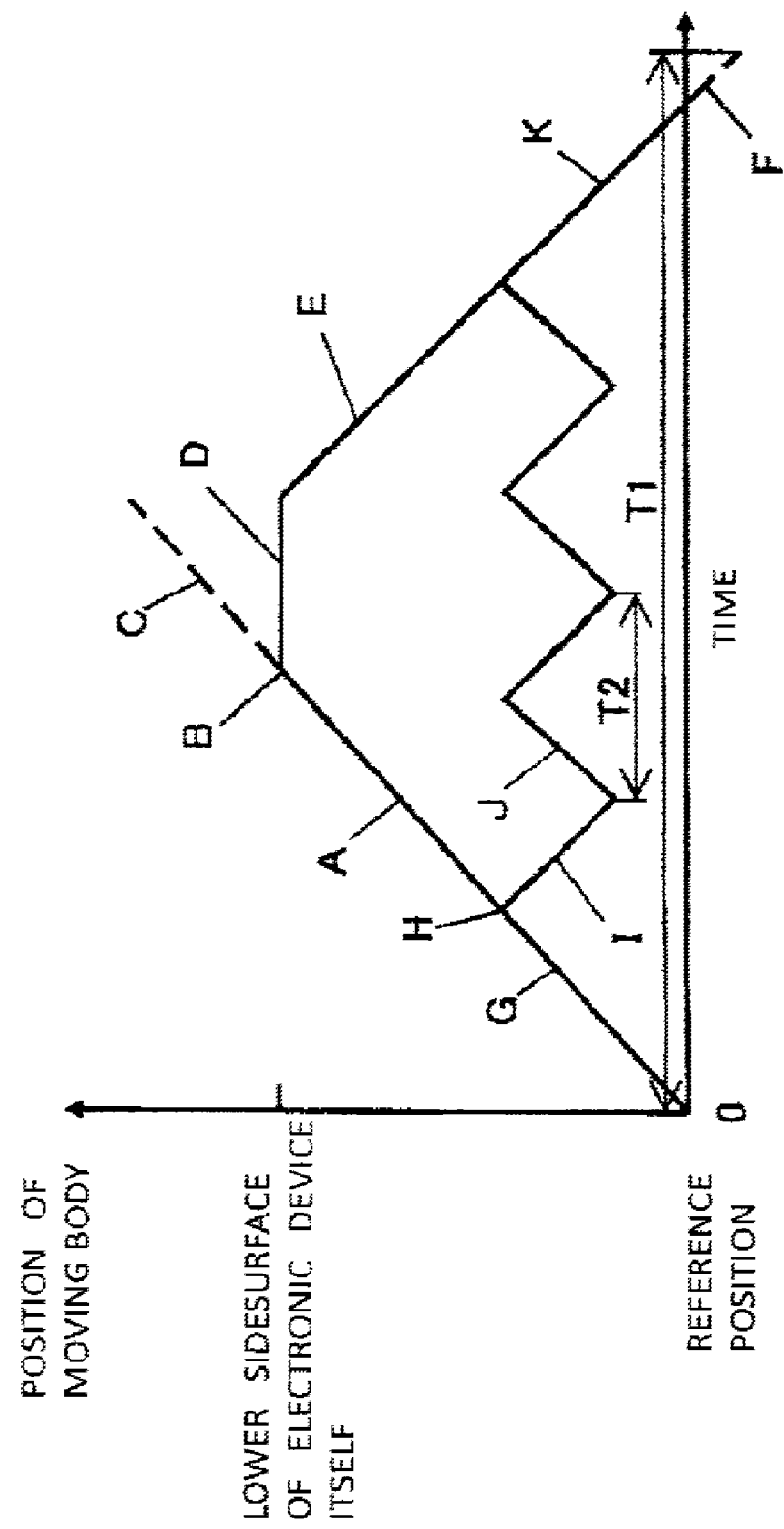
FIG. 17 represents, in graph forms, the relationship between the position of the moving body and the time required for moving the moving body.

FIG. 17 represents one example of the position and time relationship for the moving body 14 in its two modes.

When the moving body 14 is placed in the first mode, it moves upwardly from its reference position along the driving shaft 9 (A), and is then allowed to hit against the lower side surface 2b of the electronic device (B). After the hitting of the moving body 14, the driving voltage still remains to be applied, causing the moving body 14 to try to move further so that the hitting can be assured (C), but the moving body 14 remains to hit against the lower side surface 2b of the electronic device and it remains to be in that position (D).

After the upper side surface 14d of the moving body 14 has hit against the lower side surface 21b of the electronic device, the waveforms of the driving voltage will be reversed so that the moving body 14 can be moving downwardly along the driving shaft 9, going back to its reference position (E). After the moving body 14 has gone back to its reference position, the driving voltage will still be applied, thus causing the moving body 14 to try to move further downwardly (F), but the moving body 14 will not move away from its reference position. The moving body 14 can move over the relatively long distance, which means that the time (T1) required for one operation is relatively long.

When the moving body 14 is placed in the second mode, on the other hand, it is possible to have the form in which the moving body 14 can move upwards and downwards alternately along the driving shaft 9 without having to cause its upper side surface 14d to hit against the lower side surface 2b of the electronic device.

In this form, when the moving body 14 has moved from its reference position toward the upper side of the driving shaft 9 (G), the waveform of the driving voltage will be switched to allow the moving body 14 to move downwardly (I) before the upper side surface 14d of the moving body 14 can hit against the lower side surface 2b of the electronic device (H). Then, the waveform of the driving voltage will be switched to allow the moving body 14 to move upwardly (J). After repeating (I) and (J), the moving body 14 will be moved back to its reference position (K).

Within the region in which the upper side surface 14d of the moving body 14 has not yet reached the same height level as the upper side end of the casing 3, the moving body 14 will move upwards and downwards alternately along the driving shaft 9 with a short frequency (T2) without having to cause the moving body 14 to hit against the lower side surface 2b of the electronic device, and it will then produce the vibration. This vibration will be transmitted to the electronic device by way of the casing 3.

The time required for the step (G) and the time required for the step (K) may be longer than the time required for the step (I) and the time required for the step (J) so that the vibration can be produced continually without having to cause the moving body 14 to hit against the lower side surface 2b of the electronic device and the casing 3 when the moving body 14 is placed in its reference position.

The first mode may be used, for example, when the linear driving device 1 is mounted in the electronic device and the touch feeling feedback will be returned and transmitted to the finger or pen in the form of the slight rapid vibratory movements in response to a particular operation made by the human operator and from which the operator can have the impression that the particular operation has been made surely and correctly.

The second mode may be used, for example, when the arrival information from the electronic device is transmitted to the proprietor in the form of the slight rapid vibratory movements.

It may be appreciated from the current embodiment 5 that, by only permitting the linear driving device 1 to control the driving voltage to be applied to the slight rapid vibratory producing member 8 as described above, the switching can be made between the two forms, that is, the form in which the upper side surface 14d of the moving body 14 in the first mode is allowed to hit against the lower side surface 2b of the electronic device and the form in which the moving body 14 in the second mode can move upwards and downwards alternately along the driving shaft 9 without having to allow its upper side surface 14d to hit against the lower side surface 12b of the electronic device. Specifically, the first mode can be provided when the switching is made at the longer frequency (T1) during which the moving body 14 can move upwards and downwards alternately along the driving shaft 9 while the second mode can be provided when the switching is made at the shorter internal (T2).

The electronic device in which the linear driving device that has been described in accordance with any of the embodiments is integrated may include, without any limitations, the type of electronic device having a display in which the touch panel function is integrated and/or the type of electronic device having the input unit using the operating keys. The linear driving device may be integrated in any other types such as the touch pen for touching the touch panel, the wrist watch and the like.

In addition to the electronic devices listed above, the linear driving device may be integrated in the human body fitting articles such as the finger ring, the broach, the bandanna and the like.

Regardless of whether the linear driving device should be mounted in any type of the electronic device or any type of the human body fitting article that have been described above, the upper side surface 14d of the moving body 14 can be allowed to hit against the particular type of the electronic device or the particular type of the human body fitting article. This can improve the touch feeling feedback that will be returned and transmitted to the finger or pen in the form of the slight rapid vibratory movements in response to a particular operation made by the human operator and from which the operator can have the impression that the particular operation has been made surely and correctly.

What is claimed is:

1. A linear driving device which comprises:
   a driving shaft movable in an axial direction thereof;
   a vibration member coupled with one end of said driving shaft and for causing said driving shaft to be moved in said axial direction;
   a casing for supporting at least either said driving shaft or said vibration member so that said driving shaft can be moved in said axial direction; and
   a moving body to be coupled with said driving shaft so that said moving body can be moved in the axial direction of said driving shaft by the movements of said driving shaft in said axial direction, wherein
   a component of said driving shaft is arranged to hit against a surface of the moving body when said moving body moves from one end toward another end of said driving shaft to stop said moving body from moving further toward the another end of said driving shaft,
   said moving body includes a support coupled with said driving shaft, a weight portion constructed as a separate form of said support, and a plate-like body for linking said support with said weight portion, and
   said plate-like body has an elastic property and elastically links said support with said weight portion.

2. The linear driving device as defined in claim 1, wherein, when said moving body moves to said another end side of said driving shaft, at least the another end of said part of said moving body which forms the surface facing the another end opposite to said one end of said moving body may be exposed from said casing at the level of the same height as the end of the said casing located on said another end.

3. The linear driving device as defined in claim 1, wherein, when said moving body moves to said another end of said driving shaft, at least the another end of said part of said moving body which forms the surface facing the another end opposite to said one end of said moving body may be protruded from an end of said casing located on said another end.

4. The linear driving device as defined in claim 1, wherein said part of said moving body which forms the surface facing the another end opposite to said one end of said moving body is a protruded portion provided on the another end opposite to said one end of said moving body and wherein the forward end of said protruded portion may hit against said component which stops said moving body from moving further toward the another end of said driving shaft.

5. The linear driving device as defined in claim 1, wherein said vibration member is formed from a thin plate, said thin plate including an elastic thin plate and flexible thin plate disposed on at least one side of said elastic thin plate and said thin plate is deformed like a bowl form when a driving voltage is applied across said elastic thin plate, and wherein said vibration member is rigidly fixed to said casing such that the circumferential edge portion of said vibration member is fixed at the points arranged at equal intervals around said circumferential edge portion.

6. The linear driving device as defined in claim 1, wherein, when said moving body moves toward said another end of said driving shaft, said moving body moves alternately in the axial direction of said driving shaft within the region where said another end of said part of said moving body which forms the surface facing the another end opposite to said one end of said moving body does not reach the level of the same height as the end of said casing on said another end by controlling the voltage applied across said vibration member.

7. The linear driving device as defined in claim 1, wherein a soundproofing material is provided on said one end of said moving body or on the surface of said casing facing opposite to said one end of said moving body.

8. The linear driving device as defined in claim 1, wherein said casing has an air gap through which the external side of said casing can communicate with the internal side of said casing within which said driving shaft and said moving body are provided.

9. An electronic device wherein the electronic device is equipped with the linear driving device as defined in claim 1.

10. A human body fitting article wherein the human body fitting article is equipped with the linear driving device as defined in claim 1.

* * * * *